(12) United States Patent
Takechi

(10) Patent No.: US 10,797,088 B2
(45) Date of Patent: Oct. 6, 2020

(54) SEMICONDUCTOR DEVICE, DISPLAY APPARATUS, METHOD OF MANUFACTURING SEMICONDUCTOR DEVICE AND METHOD OF MANUFACTURING DISPLAY APPARATUS

(71) Applicant: Tianma Japan, Ltd., Kanagawa (JP)

(72) Inventor: Kazushige Takechi, Kanagawa (JP)

(73) Assignee: TIANMA MICROELECTRONICS CO., LTD., Shenzhen (CN)

( * ) Notice: Subject to any disclaimer, the term of this patent is extended or adjusted under 35 U.S.C. 154(b) by 0 days.

(21) Appl. No.: 15/704,076

(22) Filed: Sep. 14, 2017

(65) Prior Publication Data

US 2018/0076241 A1 Mar. 15, 2018

(30) Foreign Application Priority Data

Sep. 14, 2016 (JP) ................................. 2016-179542
Jun. 29, 2017 (JP) ................................. 2017-127871

(51) Int. Cl.
*H01L 27/12* (2006.01)
*H01L 27/32* (2006.01)

(52) U.S. Cl.
CPC ........ *H01L 27/1251* (2013.01); *H01L 27/124* (2013.01); *H01L 27/127* (2013.01); *H01L 27/1225* (2013.01); *H01L 27/3262* (2013.01)

(58) Field of Classification Search
CPC .............. H01L 27/1222; H01L 27/127; H01L 29/78606; H01L 27/1214; H01L 27/124; H01L 27/1229; H01L 27/1251
See application file for complete search history.

(56) References Cited

U.S. PATENT DOCUMENTS

| | | | | |
|---|---|---|---|---|
| 2011/0253998 A1* | 10/2011 | Theiss | ............... | H01L 29/78696 257/43 |
| 2012/0286279 A1* | 11/2012 | Hsu | ........................ | H01L 21/268 257/66 |
| 2014/0197416 A1* | 7/2014 | Qin | .................... | H01J 37/32412 257/66 |
| 2015/0055051 A1* | 2/2015 | Osawa | ................ | H01L 27/1225 349/48 |
| 2015/0325602 A1* | 11/2015 | Im | ........................ | H01L 27/1222 257/43 |
| 2017/0155000 A1* | 6/2017 | Moon | ............... | H01L 29/78606 |

* cited by examiner

*Primary Examiner* — Didarul A Mazumder
(74) *Attorney, Agent, or Firm* — Nixon & Vanderhye

(57) ABSTRACT

A semiconductor device includes an insulating substrate, a polysilicon layer, a first-gate-insulating layer, a first metal layer, an oxide-semiconductor layer, a second-gate-insulating layer, a second metal layer, a first insulating interlayer, a third metal layer, a first top gate planar type thin film transistor in which the polysilicon layer serves as a channel, and a second top gate planar self-aligned type thin film transistor in which the oxide-semiconductor layer serves as a channel. The gates of the first top gate planar type thin film transistor and the second top gate planar self-aligned type thin film transistor are made of the first and second metal layers, respectively. The sources and the drains of the first top gate planar type thin film transistor and the second top gate planar self-aligned type thin film transistor are made of the third metal layer.

9 Claims, 21 Drawing Sheets

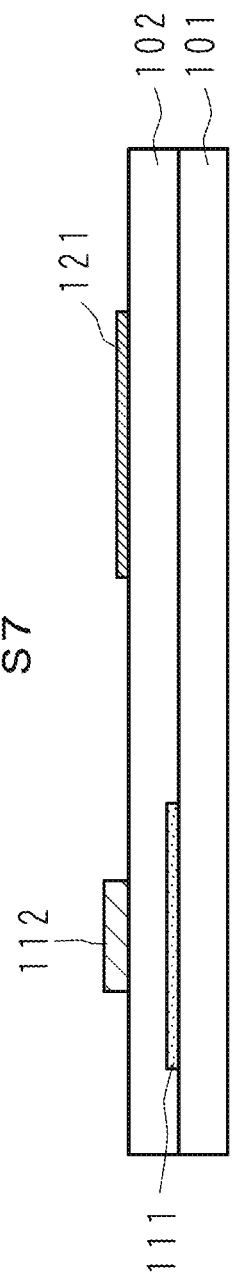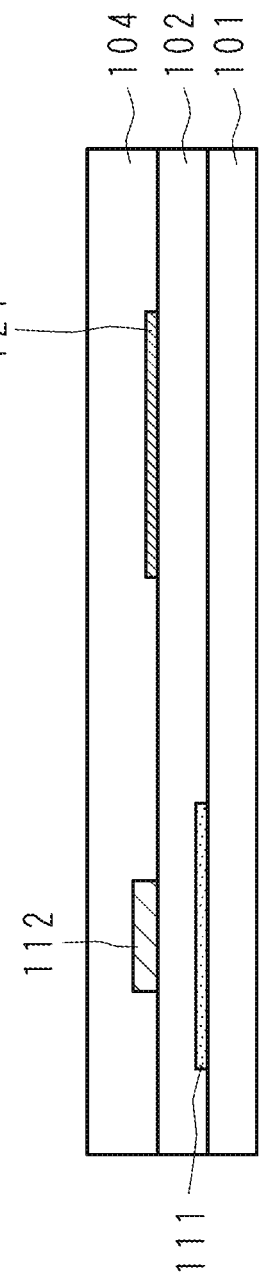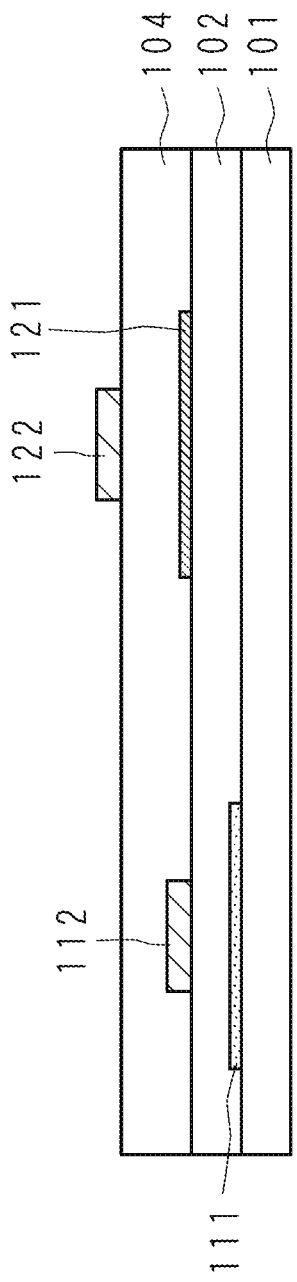

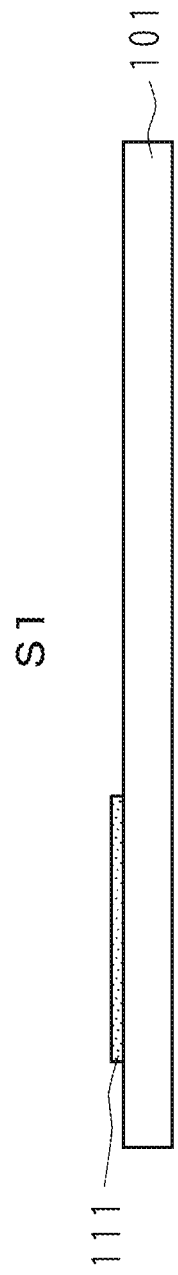
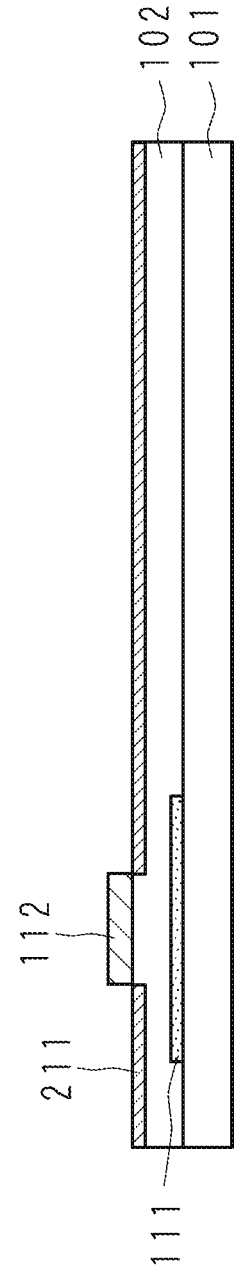
FIG. 10A
FIG. 10B
FIG. 10C

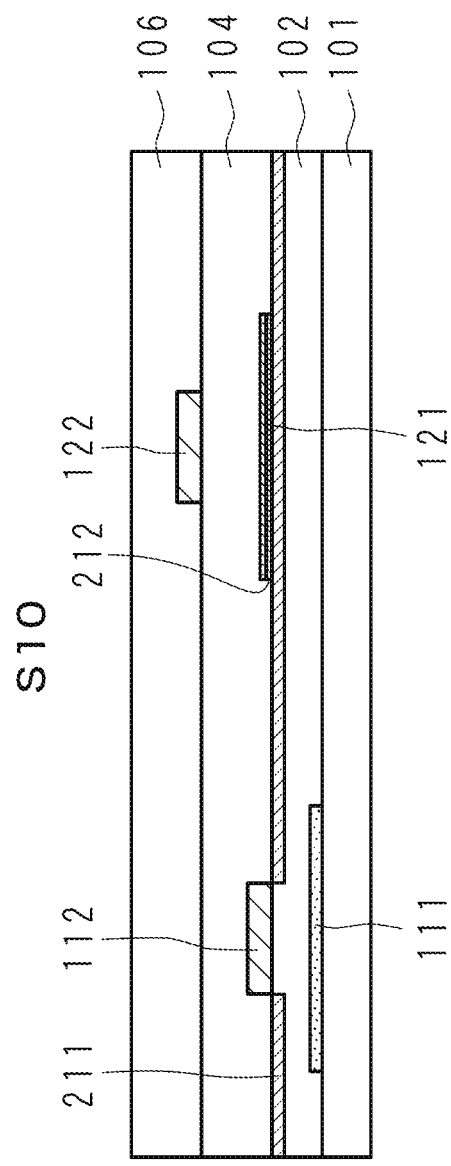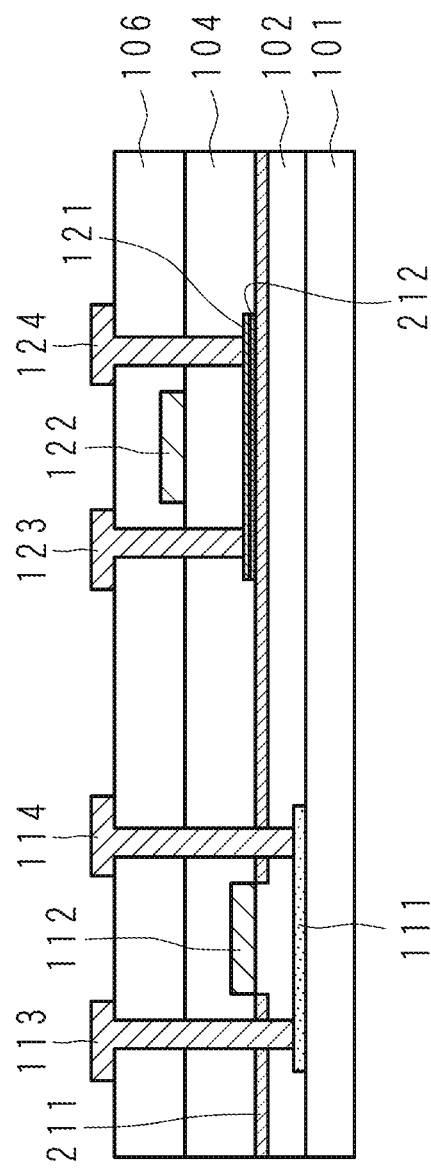

FIG. 17A  S1
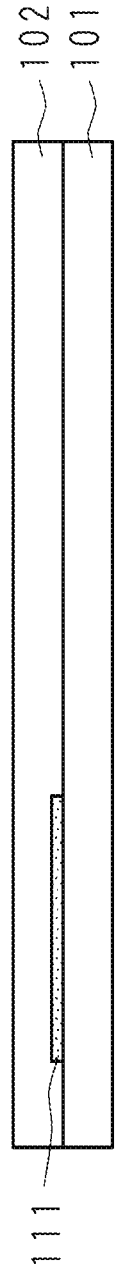
FIG. 17B  S2
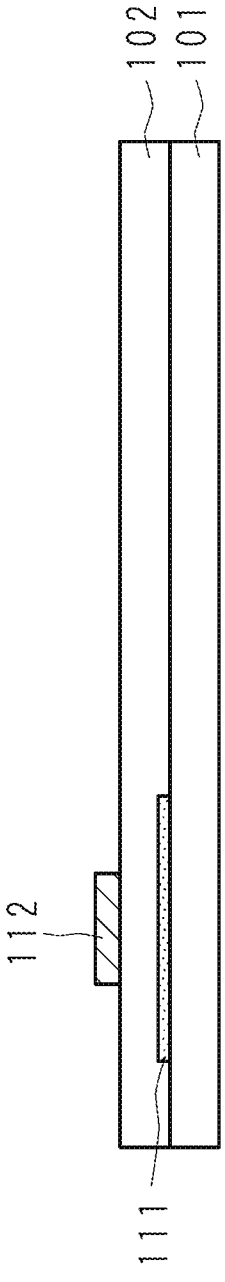
FIG. 17C  S3
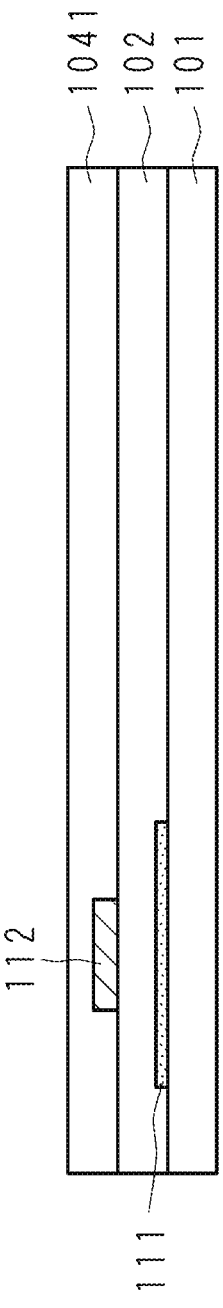
FIG. 17D  S4~S6 (HYDROGENATION) S13

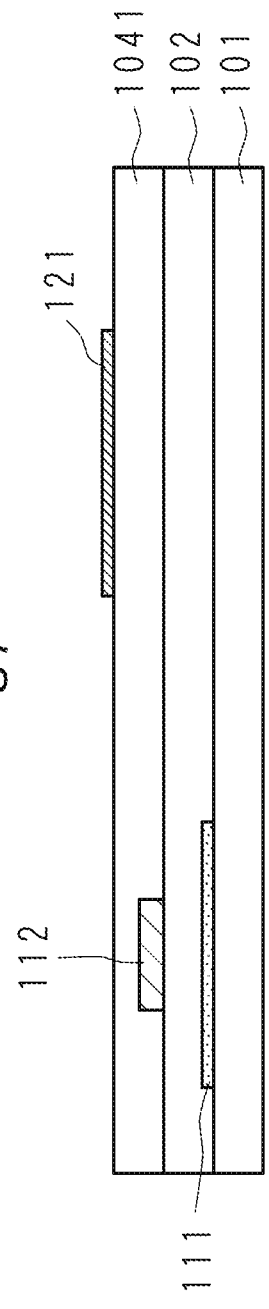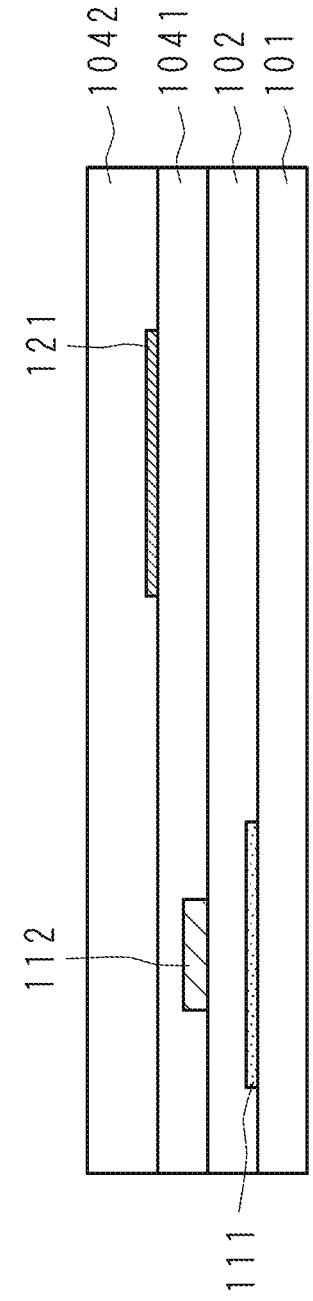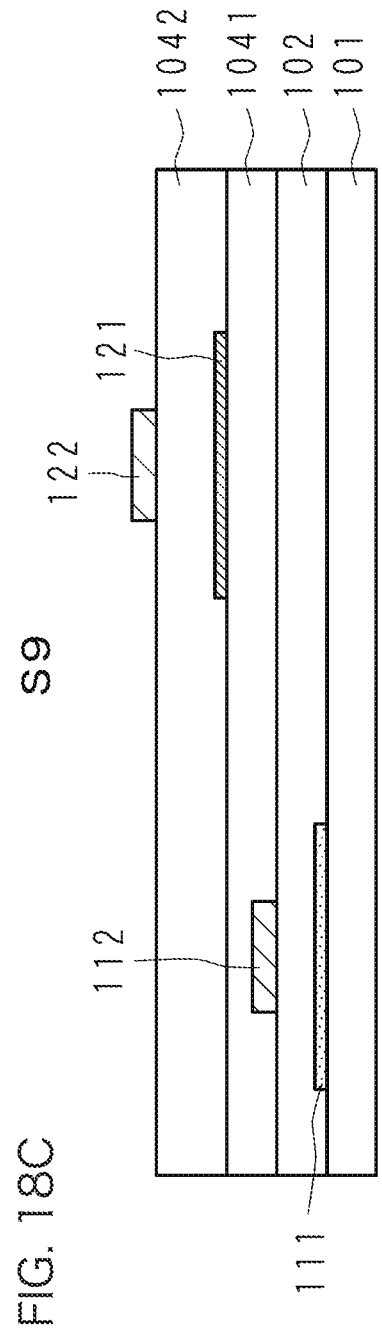

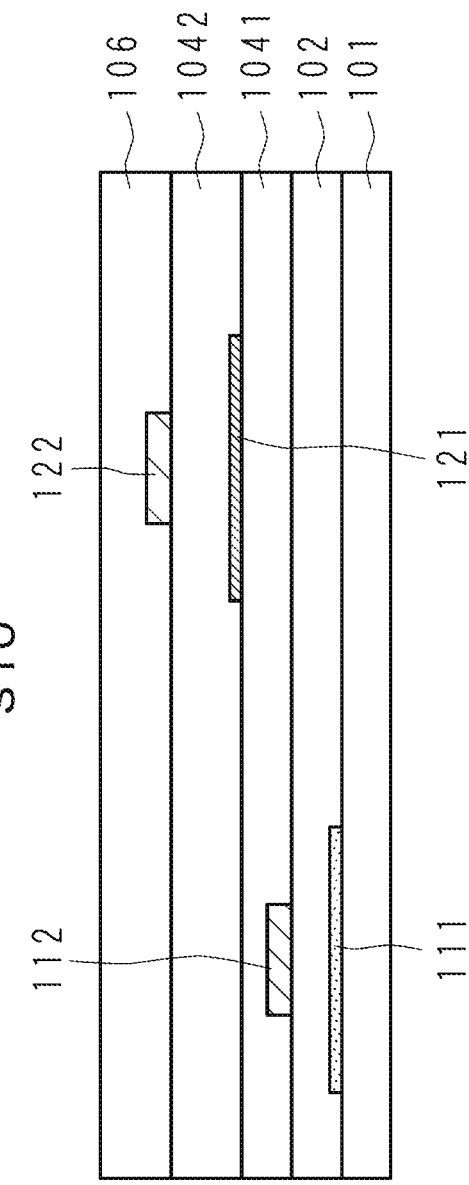
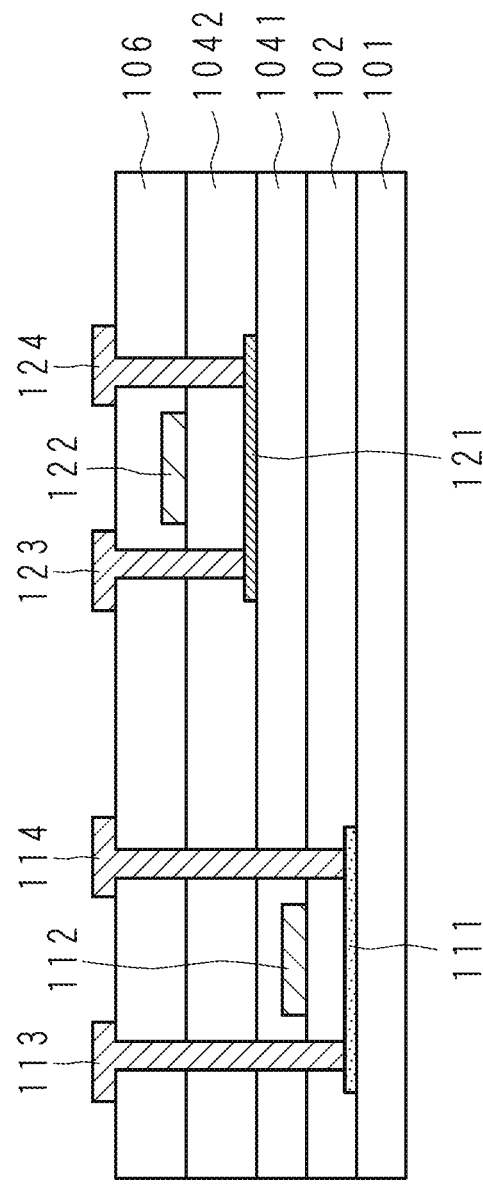

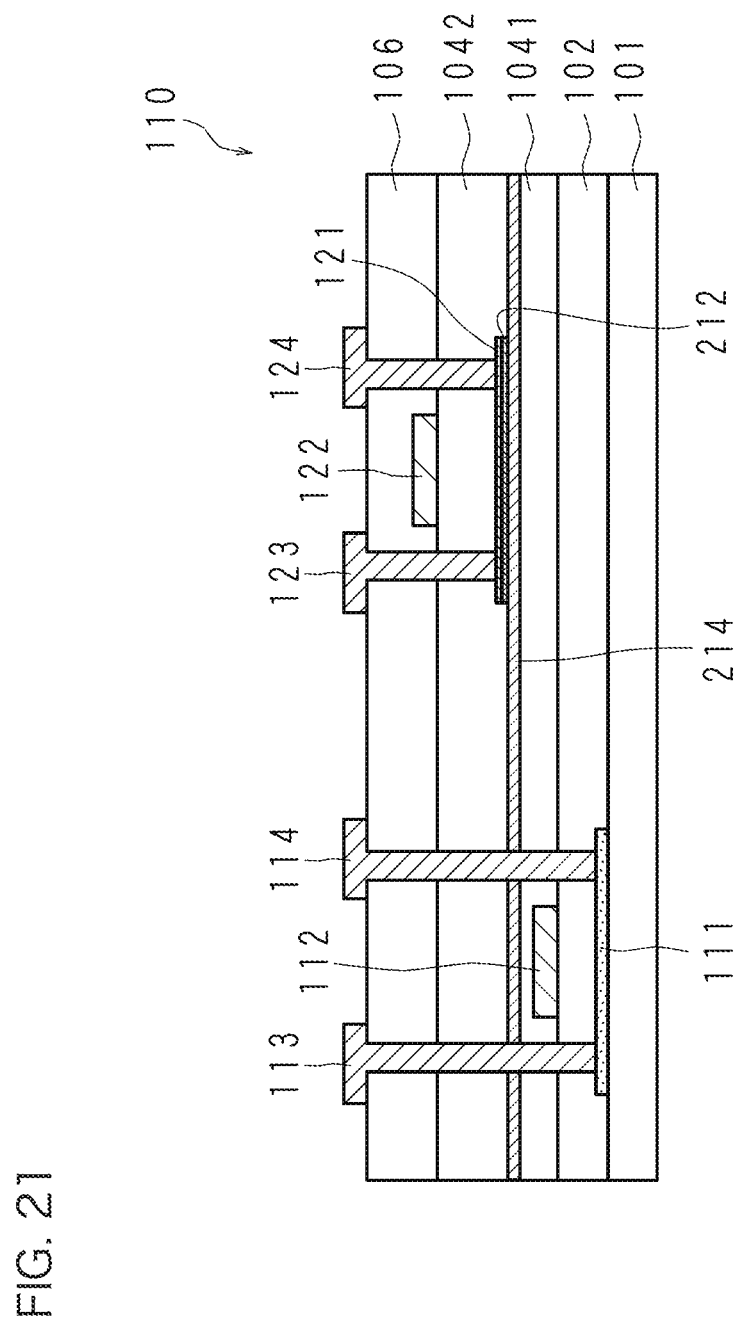

SEMICONDUCTOR DEVICE, DISPLAY APPARATUS, METHOD OF MANUFACTURING SEMICONDUCTOR DEVICE AND METHOD OF MANUFACTURING DISPLAY APPARATUS

CROSS-REFERENCE TO RELATED APPLICATIONS

This Nonprovisional application claims priority under 35 U.S.C. § 119(a) on Patent Application No. 2016-179542 filed in Japan on Sep. 14, 2016 and Patent Application No. 2017-127871 filed in Japan on Jun. 29, 2017, the entire contents of which are hereby incorporated by reference.

FIELD

The present application relates to a semiconductor device, a display apparatus, a method of manufacturing the semiconductor device and a method of manufacturing the display apparatus.

BACKGROUND

In a display apparatus such as an organic electro luminescence display apparatus, a liquid crystal display apparatus or the like, a thin film transistor (TFT) is used in a pixel circuit. Examples of thin-film transistors include an a-Si (amorphous silicon) thin film transistor, a low temperature polysilicon (LTPS) thin film transistor, and a thin film transistor using an oxide semiconductor film.

The a-Si thin film transistor is a thin film transistor containing a-Si in an active layer. The LTPS thin film transistor is a thin film transistor containing LTPS in an active layer. The oxide thin film transistor is a thin film transistor containing an oxide semiconductor in an active layer.

Here, comparing between the characteristics of the LTPS thin film transistor and the oxide thin film transistor, the following differences are observed. The LTPS thin film transistor requires a long channel length, which increases the occupied area. In comparison, the oxide thin film transistor may have a short channel length, which makes the occupied area small. The LTPS thin film transistor generates hysteresis in the source drain current for the gate voltage. In comparison, the oxide thin film transistor generates minor hysteresis. The LTPS thin film transistor has a high switching performance. In comparison, the oxide thin film transistor has a low switching performance.

In recent years, a semiconductor device has been proposed in which both the LTPS thin film transistor and the oxide thin film transistor are mounted thereto while taking advantage of the characteristics of the two thin film transistors. For example, United States Unexamined Patent Application Publication No. 2015/0055051 proposes a semiconductor device in which an LTPS thin film transistor and an oxide thin film transistor are mounted in a pixel circuit, and a display apparatus comprising the semiconductor device.

However, in the related art such as United States Unexamined Patent Application Publication No. 2015/0055051, the gate insulating layer of the LTPS thin film transistor and the gate insulating layer of the oxide thin film transistor are formed of one same layer. This causes the following problems.

In the manufacturing steps of the LTPS thin film transistor, typically, an activation step and a hydrogenation step are performed after the gate is formed. In the activation step or the hydrogenation step, hydrogen with small atomic and molecular sizes is easily diffused in a gate insulating layer, reaching a polysilicon film formed under the gate insulating layer. The hydrogen that reached the polysilicon film terminates a dangling bond defect at the polysilicon film or the interface. This stabilizes the characteristic of the LTPS thin film transistor. Likewise, by the hydrogen being diffused, an oxide-semiconductor layer of an oxide thin film transistor is exposed to a hydrogen atmosphere in the hydrogenation step. Hydrogen has a function of reducing an oxide semiconductor. High-density oxygen deficiency is then generated in the oxide semiconductor. The oxygen deficiency functions as a donor, which induces high-density carriers in the oxide semiconductor. This results in a lowered resistance value for the oxide-semiconductor layer. Accordingly, the formed oxide thin film transistor indicates a normally-on characteristic. Normally-on means that the drain current flows and it keeps turn on state of the transistor when there is no voltage applied to the gate of the transistor. In the case where the oxide thin film transistor is used for a purpose where normally-on is not preferable, a device indicating the normally-on characteristic would be a defective product. This may, as a result, lead to lowering in the yield of semiconductor devices.

SUMMARY

One aspect of the present disclosure is to provide a semiconductor device and the like in which reduction of yield is suppressed.

According to one aspect, a semiconductor device includes an insulating substrate, a polysilicon layer formed on the insulating substrate, a first-gate-insulating layer formed on the polysilicon layer, a first metal layer formed on the first-gate-insulating layer, an oxide-semiconductor layer formed on the first-gate-insulating layer, a second-gate-insulating layer formed on the oxide-semiconductor layer, a second metal layer formed on the second-gate-insulating layer, a first insulating interlayer formed on the second metal layer, a third metal layer formed on the first insulating interlayer, a first top gate planar type thin film transistor in which the polysilicon layer serves as a channel and which has a source, a drain and a gate, and a second top gate planar self-aligned type thin film transistor in which the oxide-semiconductor layer serves as a channel and which has a source, a drain and a gate, wherein the gate of the first top gate planar type thin film transistor is made of a first metal layer, the gate of the second top gate planar self-aligned type thin film transistor is made of the second metal layer, the source and the drain of the first top gate planar type thin film transistor and the source and the drain of the second top gate planar self-aligned type thin film transistor are made of the third metal layer, and the source or the drain of the first top gate planar type thin film transistor and the gate of the second top gate planar self-aligned type thin film transistor are electrically connected to each other.

According to one aspect of the present disclosure, a reduction in yield is suppressed.

BRIEF DESCRIPTION OF THE DRAWINGS

FIGS. 8A-8C are cross-sectional views illustrating a manufacturing procedure for the semiconductor device;

FIGS. 10A-10C are cross-sectional views illustrating a manufacturing procedure for a semiconductor device according to Embodiment 2;

FIGS. 12A and 12B are cross-sectional views illustrating a manufacturing procedure for the semiconductor device according to Embodiment 2;

FIGS. 17A-17D are cross-sectional views illustrating a manufacturing procedure for the semiconductor device;

FIGS. 18A-18C are cross-sectional views illustrating a manufacturing procedure for the semiconductor device;

FIGS. 19A and 19B are cross-sectional views illustrating a manufacturing procedure for the semiconductor device;

FIG. 21 is a cross-sectional view illustrating a configuration example of a semiconductor device according to Embodiment 5.

DESCRIPTION OF EMBODIMENTS

Figure 1:
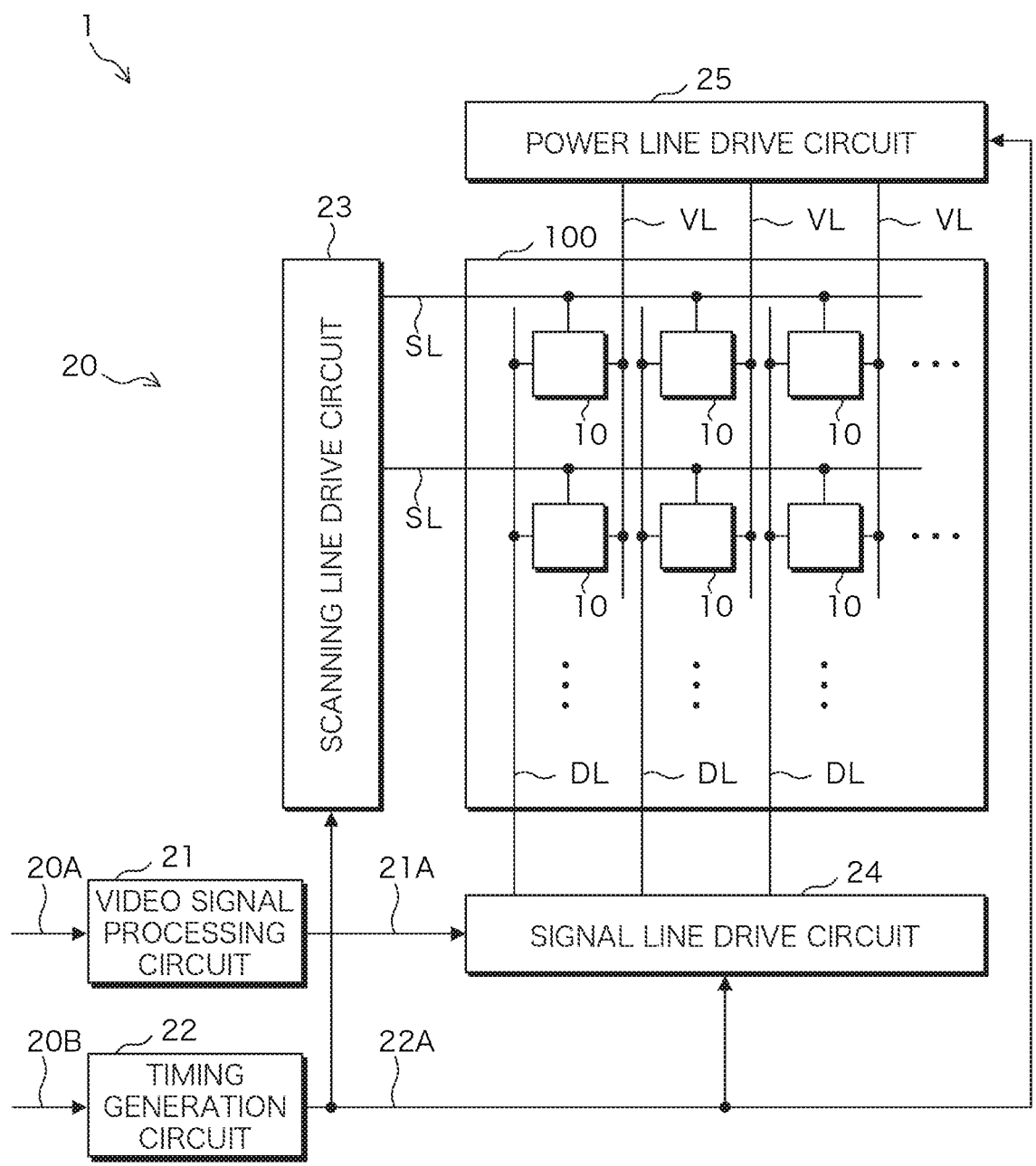
FIG. 1 is a block diagram illustrating a schematic configuration of an organic EL display apparatus.

Embodiments will be described below in detail with reference to the drawings. It is noted that the ordinal numbers such as "first" and "second" in the specification and claims are denoted for the purpose of clarifying the relationship between elements and preventing the mix-up of elements. These ordinal numbers are therefore not to limit the number of elements.

Moreover, the term "connect" means that connected elements are electrically connected with each other. The expression "electrically connect" also includes the cases where elements are connected through an electrical element such as an electrode, a wiring, a resistance or a capacitor.

The expression "on an insulating layer" means to explicitly indicate the direction in which layers are laminated, and does not necessarily mean that an element is adjacent to the insulating layer. For example, the expression "forming an oxide-semiconductor layer on a first-gate-insulating layer" includes the case where the first-gate-insulating layer and the oxide-semiconductor layer are adjacent to each other, and also the case where the first-gate-insulating layer and the oxide-semiconductor layer are disposed while another layer is interposed between them. Moreover, "upper" indicates the upper direction in the drawings.

The size and scale of each component in the drawings are appropriately modified so as to ensure the visibility of the drawings. Moreover, hatched parts in the drawings are intended to distinguish components from each other, not necessarily indicating cut planes.

The cross-sectional view illustrating a layered state is for illustrating the order of layering, while the thickness and size of each layer as well as the relationship of the thicknesses between layers (dimensional relationship) are not limited to the ones illustrated.

Hereinafter, as an application example of the semiconductor device, a pixel drive circuit in an organic EL display apparatus is described. FIG. 1 is a block diagram illustrating a schematic configuration of an organic EL display apparatus 1. The organic EL display apparatus 1 includes a display panel 100 and a drive circuit 20.

An image is displayed on the display panel 100. The display panel 100 is driven by active-matrix. The display panel 100 has a pixel array unit. Multiple pixels 10 are included in the pixel array unit. The pixels 10 are arranged in matrix. Each of the pixels 10 corresponds to any one of the pixels of red (R), green (G), blue (B) and white (W), for example. Each pixel 10 includes an organic EL element.

The pixel array unit includes power lines VL as well as multiple scanning lines (scan lines) SL and signal lines (data lines) DL. The multiple scanning lines SL are provided along the row direction of the pixel array unit, for example. The multiple signal lines DL are provided along the column direction of the pixel array unit, for example. The power line VL is provided along each of the signal lines DL. One end of each of the scanning lines SL, signal lines DL and power lines VL is connected to the drive circuit 20. Each of the pixels 10 is so disposed as to correspond to a crossing portion of each of the scanning lines SL and each of the signal lines DL.

The drive circuit 20 drives the pixel array unit for display. The drive circuit 20 includes a video signal processing circuit 21, a timing generation circuit 22, a scanning line drive circuit 23, a signal line drive circuit 24 and a power line drive circuit 25.

The video signal processing circuit 21 performs gamma correction or overdrive correction for a digital video signal 21A input from the outside. The video signal processing circuit 21 outputs a corrected video signal to the signal line drive circuit 24.

The timing generation circuit 22 generates a control signal 22A based on a synchronization signal 20B input from the outside and outputs the generated control signal 22A. The control signal 22A serves to control the scanning line drive circuit 23, the signal line drive circuit 24 and the power line drive circuit 25 such that these circuits operate in coordination with one another.

The scanning line drive circuit 23 sequentially applies scanning line voltage to the multiple scanning lines SL in accordance with the control signal 22A. Application of the scanning line voltage allows the pixels 10 to be selected in sequence.

The signal line drive circuit 24 generates an analog video signal corresponding to a video signal input from the video signal processing circuit 21 in accordance with the control signal 22A. The generated analog video signal is applied to each signal line DL.

The power line drive circuit 25 sequentially applies power voltage to the multiple power lines VL in accordance with the control signal 22A. The power voltage controls light emission and light extinction of each organic EL element.

The drive circuit 20 controls each of the pixels 10 as follows. The pixel 10 is selected in accordance with the control signal 22A output from the scanning line drive circuit 23. To the selected pixel, a video signal voltage based on the analog video signal output from the signal line drive circuit 24 is written. It is noted that writing of a video signal means that a predetermined voltage is applied between the gate and source of a driving transistor, which will be described later.

Figure 2:
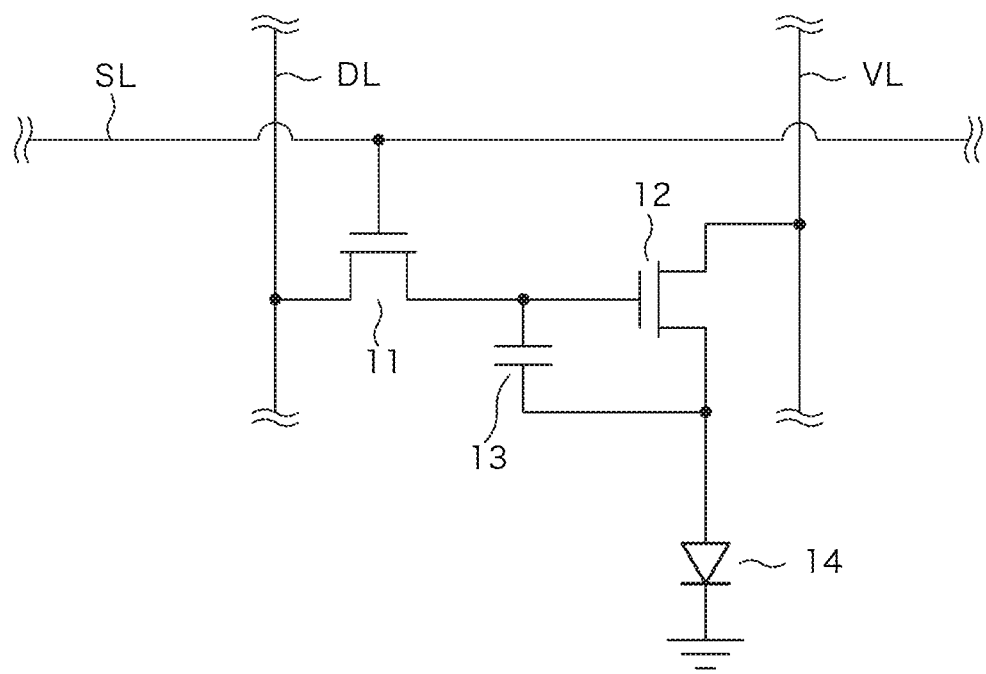
FIG. 2 is a circuit diagram illustrating an example of a pixel drive circuit provided for each pixel.

FIG. 2 is a circuit diagram illustrating an example of a pixel drive circuit provided for each pixel. The pixel drive circuit includes an organic EL element 14 which is a light emitting element, a first transistor 11, a second transistor 12 and a storage capacitor 13. An anode of the organic EL element 14 is connected to the source of the second transistor 12 and one end of the storage capacitor 13. The cathode of the organic EL element 14 is connected to the power supply ground. The other end of the storage capacitor 13 is connected to the drain of the first transistor 11. The other end of the storage capacitor 13 is also connected to the gate of the second transistor 12. The drain of the second transistor 12 is connected to the power line VL. The source of the first transistor 11 is connected to the signal line DL. The gate of the first transistor 11 is connected to the scanning line SL.

The first transistor 11 is a switch thin film transistor for selecting the pixel. The second transistor 12 is a driving thin film transistor for causing current to flow, which is necessary for the organic EL element 14 to emit light. As for the writing, when the gate of the first transistor 11 connected to the scanning line SL is turned on, the signal line DL is captured into the pixel while a voltage is written into the storage capacitor 13. Even when the gate of the first transistor 11 is turned off, the voltage written into the storage capacitor controls the second transistor 12, causing a set value of current to flow in the organic EL element 14. This maintains the operation state of the organic EL element 14 until the next writing is performed.

As described above, in the pixel drive circuit, the first transistor 11 preferably has a high switching performance. Moreover, the second transistor 12 preferably has a small hysteresis for the characteristic of the source-drain current with respect to the gate voltage. In the following embodiments, therefore, the first transistor 11 is assumed as an LTPS thin film transistor whereas the second transistor 12 is assumed as an oxide thin film transistor.

Embodiment 1

Figure 3:
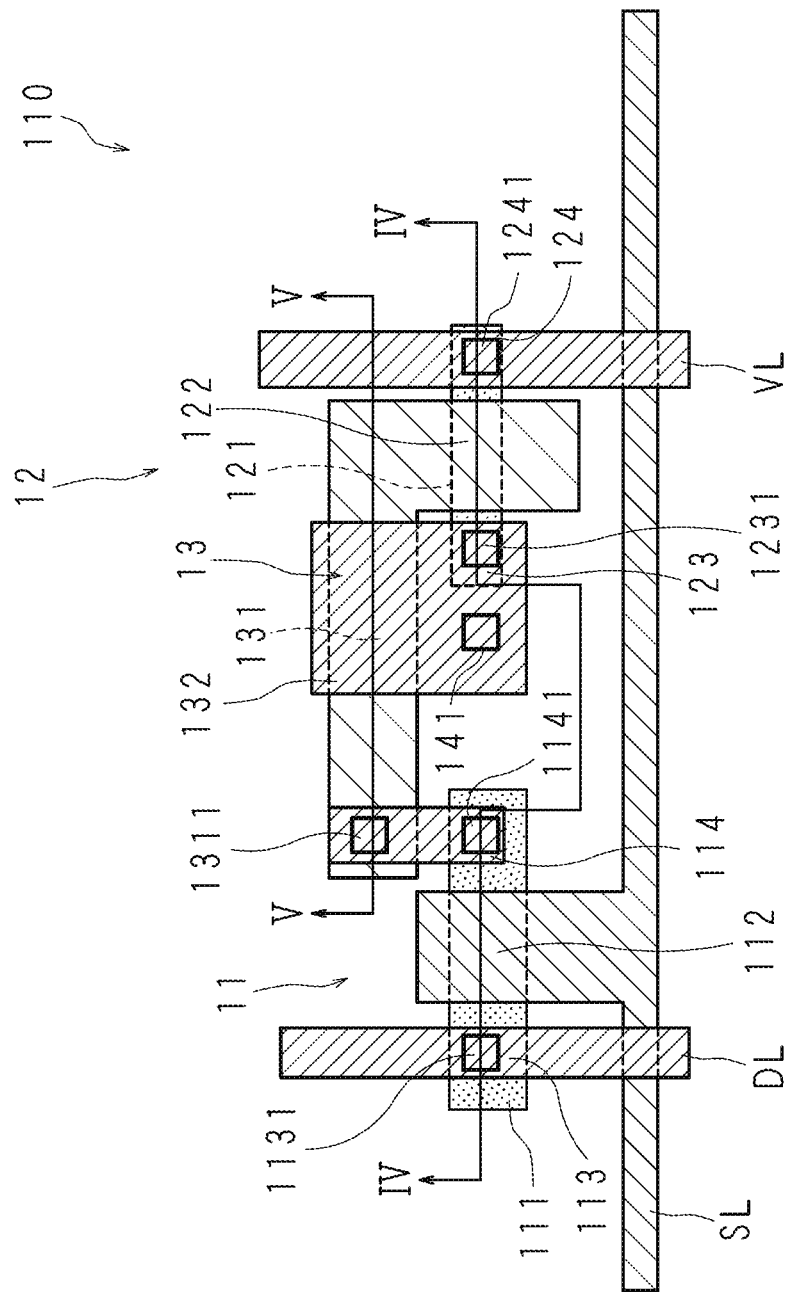
FIG. 3 is a plan view illustrating a configuration example of a semiconductor device included in a pixel drive circuit.
Figure 4:
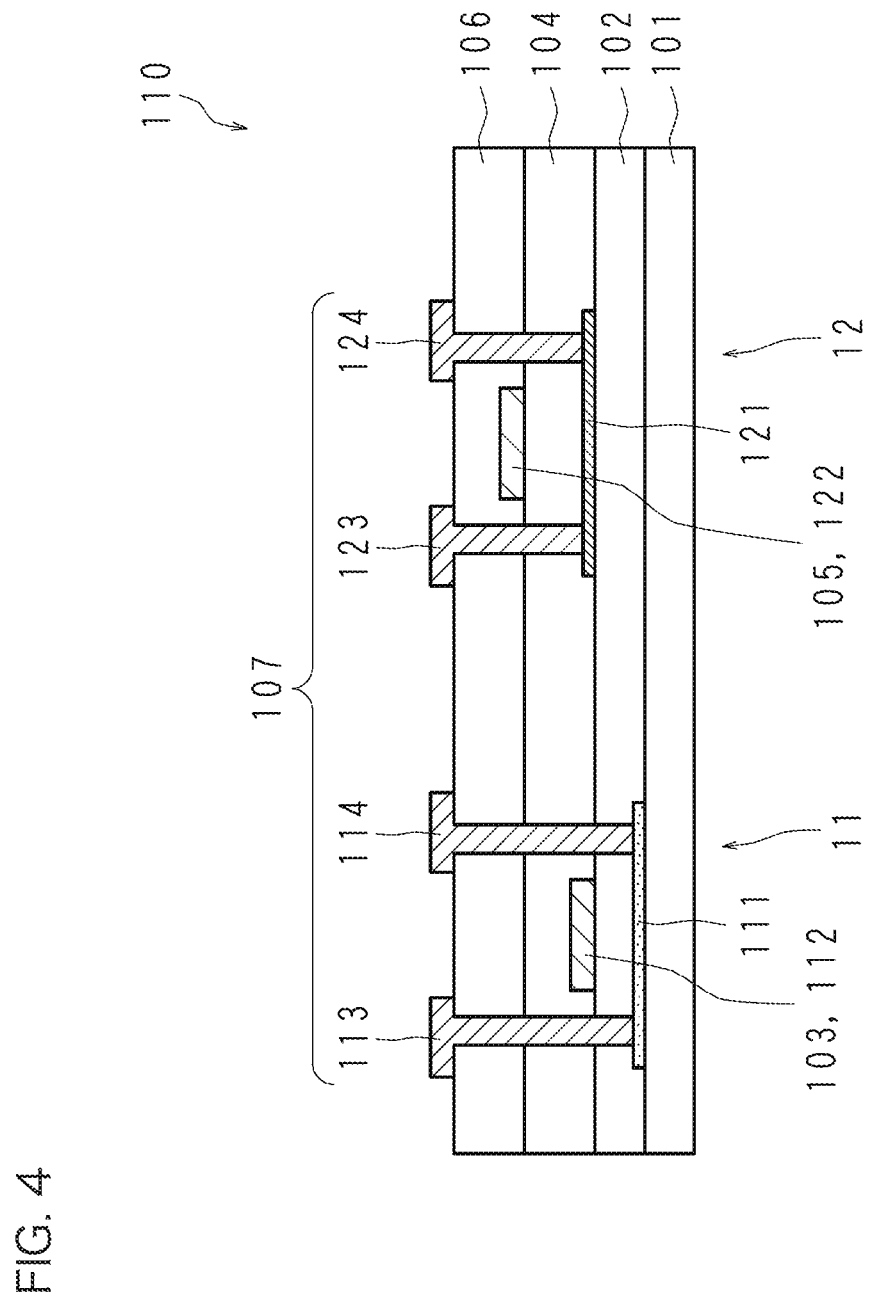
FIG. 4 is a cross-sectional view taken along the section line IV-IV in FIG. 3.

FIG. 3 is a plan view illustrating a configuration example of a semiconductor device 110 included in a pixel drive circuit. FIG. 4 is a cross-sectional view taken along the section line IV-IV in FIG. 3. The semiconductor device 110 includes an insulating substrate 101, a polysilicon layer 111, a first-gate-insulating layer 102, a first metal layer 103, an oxide-semiconductor layer 121, a second-gate-insulating layer 104, a second metal layer 105, an insulating interlayer 106 and a third metal layer 107.

In the semiconductor device 110, layers are formed on the upper surface of the insulating substrate 101 in the above-described order. That is, the polysilicon layer 111 is formed on the insulating substrate 101. The first-gate-insulating layer 102 is formed on the polysilicon layer 111. The first metal layer 103 is formed on the first-gate-insulating layer 102. The second-gate-insulating layer 104 is formed on the first metal layer 103 and the oxide-semiconductor layer 121. The second metal layer 105 is formed on the second-gate-insulating layer 104. The insulating interlayer 106 is formed on the second metal layer 105. The third metal layer 107 is formed on the insulating interlayer 106.

The insulating substrate 101 is formed of material having insulation and transparent properties. The material having insulation and transparent properties is, for example, glass. The insulating substrate 101 has a plate-like shape. The insulating substrate 101 is, for example, a glass plate. The polysilicon layer 111 is a layer made of polysilicon, e.g., low-temperature polysilicon (LTPS). The first-gate-insulating layer 102, the second-gate-insulating layer 104 and the insulating interlayer 106 are formed of insulating material. The insulating material may be, for example, silicon oxide or silicon nitride. The first metal layer 103, the second metal layer 105 and the third metal layer 107 are formed of conductive metal. The conductive metal may be, for example, aluminum, tantalum, molybdenum tantalum or molybdenum tungsten. The oxide-semiconductor layer 121 is a layer including an oxide semiconductor. The oxide semiconductor is, for example, InGaZnO.

In the semiconductor device 110, the first transistor 11 and the second transistor 12 are formed. The first transistor 11 and the second transistor 12 are aligned in the wiring direction of the scanning line SL. The first transistor 11 uses the polysilicon layer 111 as a channel. Hereinafter, the polysilicon layer 111 will also be referred to as a channel 111. The gate 112 is made of the first metal layer 103. That is, a portion of the first metal layer 103 that is opposed to the channel 111 serves as the gate 112 of the first transistor 11. The source 113 and the drain 114 of the first transistor 11 is made of the third metal layer 107. That is, the source 113 is a portion of the third metal layer 107. The source 113 is electrically connected to the channel 111 through a contact hole 1131. Likewise, the drain 114 is a portion of the third metal layer 107. The drain 114 is electrically connected to the channel 111 through a contact hole 1141. The first transistor 11 is a top gate planar type thin film transistor.

The second transistor 12 uses the oxide-semiconductor layer 121 as a channel. The gate 122 is made of the second metal layer 105. That is, a portion of the second metal layer 105 that is opposed to the oxide semiconductor (channel) 121 serves as the gate 122. The source 123 and the drain 124 of the second transistor 12 is made of the third metal layer 107. The second transistor 12 is a top gate planar self-aligned type thin film transistor.

Figure 5:
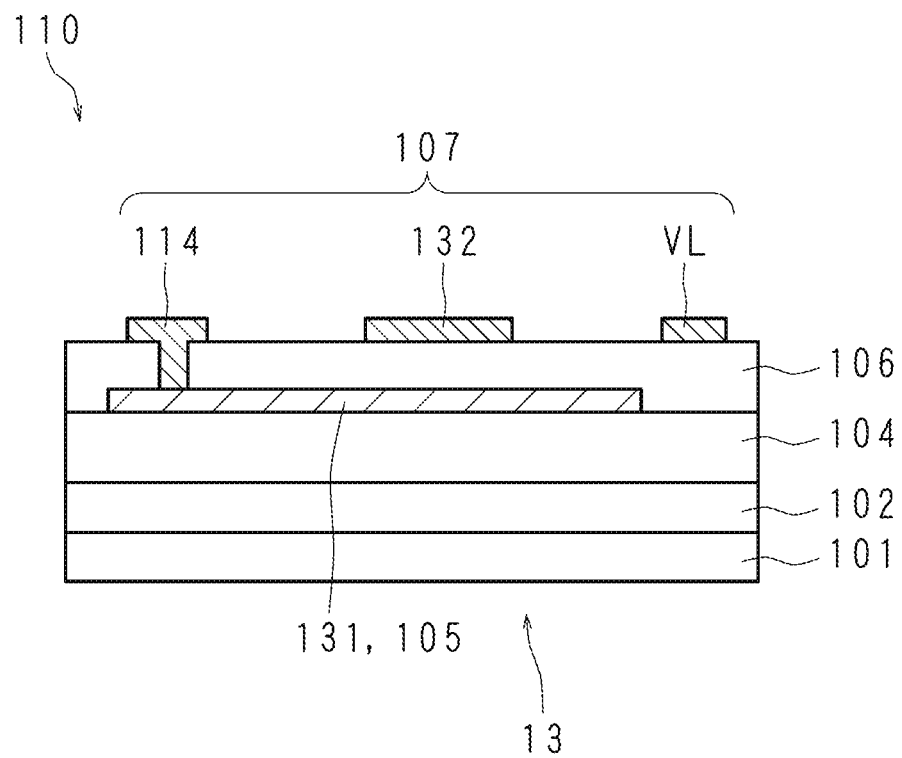
FIG. 5 is a cross-sectional view taken along the section line V-V in FIG. 3.

In the wiring direction of the scanning line SL, a storage capacitor 13 is formed between the first transistor 11 and the second transistor 12. FIG. 5 is a cross-sectional view taken along the section line V-V in FIG. 3. The storage capacitor 13 includes a lower electrode 131 and an upper electrode 132. The lower electrode 131 is made of the second metal layer 105. The second metal layer 105 including the lower electrode 131 has a plane shape inverted from an L shape (inverted L shape). A part of the portion of the inverted L shape extending in the wiring direction of the signal line DL corresponds to the gate 122 of the second transistor 12. A part of the portion of the inverted L shape extending in the wiring direction of the scanning line SL corresponds to the lower electrode 131 of the storage capacitor 13. The portion extending from the lower electrode 131 to the first transistor 11 is connected to the drain 114 of the first transistor 11 through a contact hole 1311. The upper electrode 132 is made of the third metal layer 107. The upper electrode 132 is integrated with the source 123 of the second transistor 12. A part of the third metal layer 107 that is integrated with the upper electrode 132 is provided with a contact hole 141 for electrically connecting the anode of the organic EL element 14 with the upper electrode 132.

The signal line DL is made of the third metal layer 107. The signal line DL and the source 113 of the first transistor 11 are integrated with each other. The scanning line SL is made of the first metal layer 103. A part of the first metal layer 103 has a portion extending in a direction crossing the wiring direction of the scanning line SL. This portion connects the gate 112 of the first transistor 11 and the scanning line SL. The power line VL is made of the third metal layer 107. The power line VL is integrated with the drain 124 of the second transistor 12.

Figure 6:
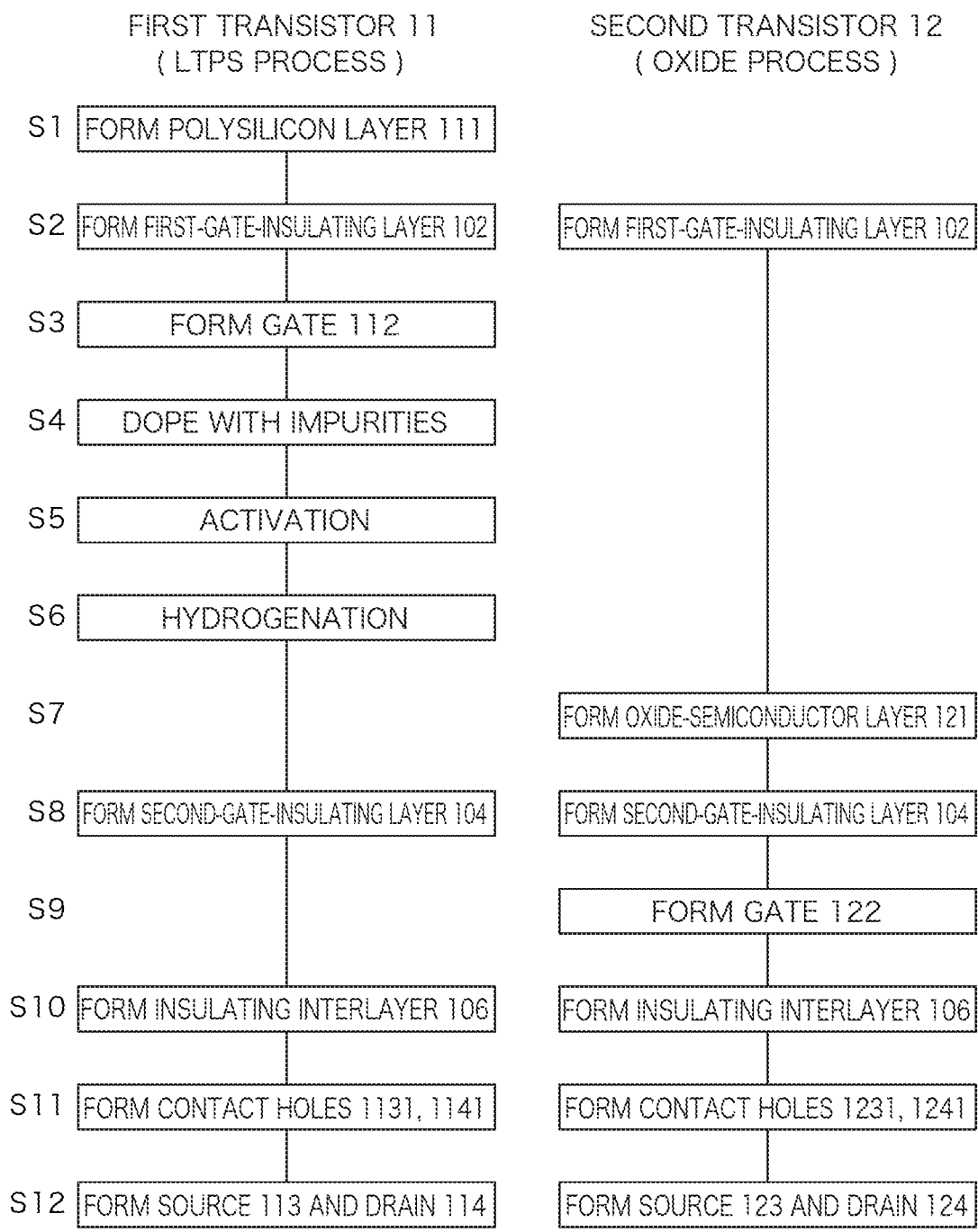
FIG. 6 is a flowchart illustrating a manufacturing procedure for a semiconductor device.

A manufacturing procedure for the semiconductor device 110 will now be described. FIG. 6 is a flowchart illustrating a manufacturing procedure for the semiconductor device 110. FIGS. 7A to 7C, 8A to 8C and 9A to 9B are cross-sectional views illustrating the manufacturing procedure for the semiconductor device 110. The cross-sections in FIGS. 7A to 7C, 8A to 8C and 9A to 9B are similar to the cross-section in FIG. 4. A polysilicon manufacturing process (LTP process) for forming the first transistor 11 and an oxide semiconductor manufacturing process for forming the second transistor 12 are carried out concurrently and in parallel. The steps illustrated side by side in FIG. 6 imply that they are performed at the same time. FIGS. 7A to 7C, 8A to 8C and 9A to 9B illustrate the finished state after the each of steps in FIG. 6. The configuration obtained after a part of the procedure illustrated in FIG. 6 will not be illustrated in FIGS. 7A to 7C, 8A to 8C and 9A to 9B.

Figure 7A:
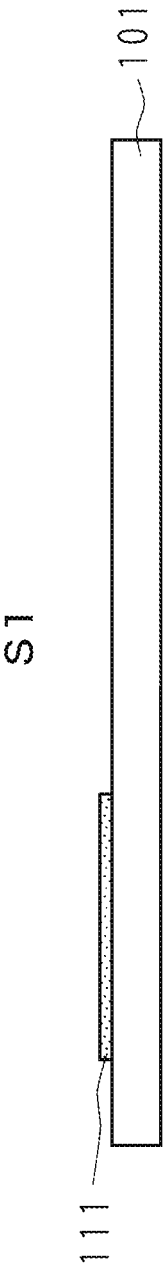
FIGS. 7A-7C are cross-sectional views illustrating a manufacturing procedure for the semiconductor device.

First, an insulating substrate 101 is prepared. The polysilicon layer 111 is formed on the insulating substrate 101 (step S1). At step S1, a-Si is deposited on the insulating substrate 101 by, for example, the chemical vapor deposition (CVD) method. The a-Si is crystallized by excimer laser annealing (ELA), to form polysilicon. Thereafter, an island step including a photoresist step and an etching step is performed. By performing these steps, the polysilicon layer 111 of an island shape having a predetermined surface area is completed. The state illustrated in FIG. 7A is thus obtained.

Figure 7B:
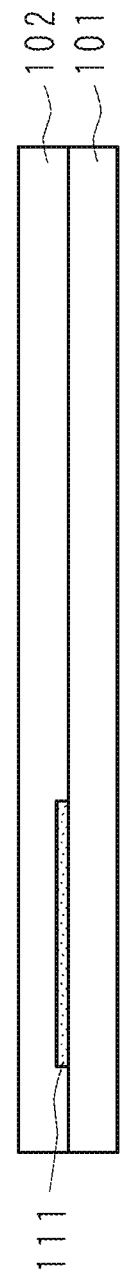
Figure 7C:
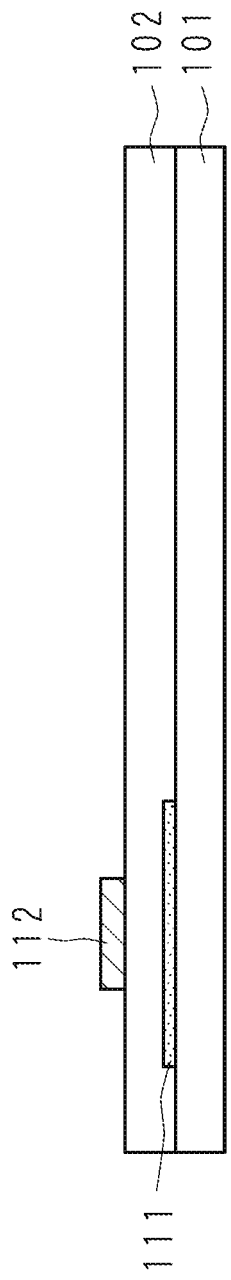

The first-gate-insulating layer 102 is formed on the insulating substrate 101 and the polysilicon layer 111 (step S2). The state illustrated in FIG. 7B is thus obtained. The gate 112 of the first transistor 11 is formed on the first-gate-insulating layer 102 (step S3). At step S3, the spattering method or the like is used to deposit the first metal layer 103. The first metal layer 103 is composed of molybdenum (Mo), or an alloy of molybdenum such as molybdenum tantalum (MoTa) or molybdenum tungsten (MoW). Thereafter, by the photoresist step, the gate 112 of an island shape is formed. The state illustrated in FIG. 7C is thus obtained.

Impurities are injected into the polysilicon layer 111 (step S4). At step S4, the polysilicon layer 111 is doped with impurities while the gate 112 serves as a mask. Subsequently, the polysilicon layer 111 is activated (step S5). At step S5, the polysilicon layer 111 is heated. The heating is performed in, for example, an electric furnace. Moreover, annealing using excimer laser is employed for the heating. The heating is performed with a temperature which would not deform the insulating substrate 101. The heating temperature is selected in a range from 300° C. to 600° C., for example.

The polysilicon layer 111 is hydrogenated (step S6). For example, at step S6, plasma hydrogenation is carried out, for example. That is, gas containing hydrogen is caused to flow in a container with pressure reduced by a vacuum pump to 1 Torr or lower to generate hydrogen plasma by high frequency discharge or the like, in which the polysilicon layer 111 is subjected to a heating process.

The oxide-semiconductor layer 121 is formed on the first-gate-insulating layer 102 (step S7). At step S7, an oxide semiconductor is deposited. The island step is performed on the deposited oxide semiconductor film. The oxide semiconductor may be, for example, IGZO which is a compound of indium, gallium, zinc, oxygen and the like. An oxide semiconductor composed of indium (In), stannum (Sn), zinc (Zn) and oxygen (O) may be employed. The state illustrated in FIG. 8A is thus obtained.

The second-gate-insulating layer 104 is formed (step S8). The state illustrated in FIG. 8B is thus obtained. A part of the second-gate-insulating layer 104 is formed on the gate 112 and the oxide-semiconductor layer 121. The other part of the second-gate-insulating layer 104 is formed on the first-gate-insulating layer 102.

The gate 122 of the second transistor 12 is formed on the second-gate-insulating layer 104 (step S9). At step S9, the spattering method or the like is used to deposit the second metal layer 105. The second metal layer 105 is composed of molybdenum (Mo), or an alloy of molybdenum such as molybdenum tantalum (MoTa) or molybdenum tungsten (MoW). Thereafter, by the photoresist step, the gate 122 of an island shape is formed. The state illustrated in FIG. 8C is thus obtained.

Figure 9A:
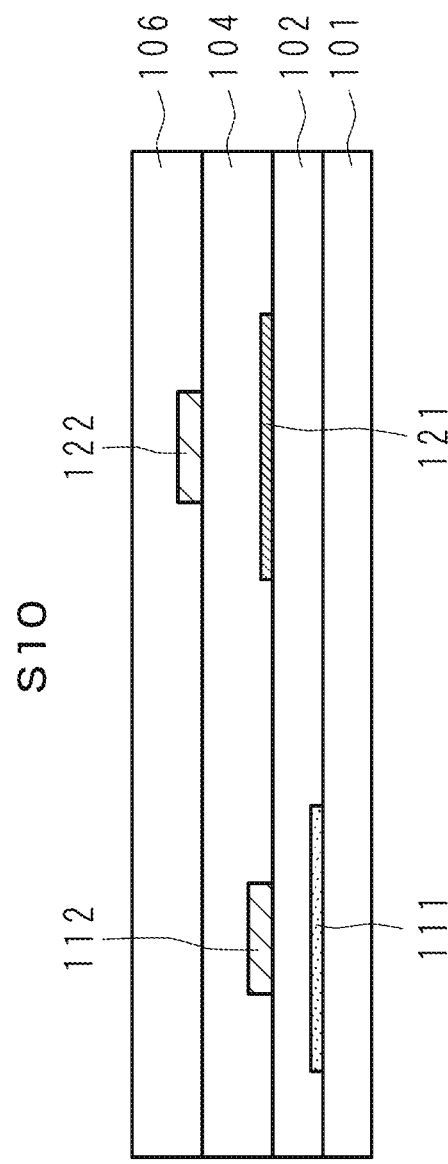
FIGS. 9A and 9B are cross-sectional views illustrating a manufacturing procedure for the semiconductor device.

The insulating interlayer 106 is formed (step S10). The state illustrated in FIG. 9A is thus obtained. A part of the insulating interlayer 106 is formed on the gate 122. The other part of the insulating interlayer 106 is formed on the first-gate-insulating layer 102.

The contact holes 1131, 1141 to the polysilicon layer 111 and the contact holes 1231, 1241 to the oxide-semiconductor layer 121 are formed (step S11). The contact holes 1131 and 1141 are holes extending from the upper surface of the insulating interlayer 106 to the upper surface of the polysilicon layer 111. The contact holes 1231 and 1241 are holes extending from the upper surface of the insulating interlayer 106 to the upper surface of the oxide-semiconductor layer 121.

Figure 9B:
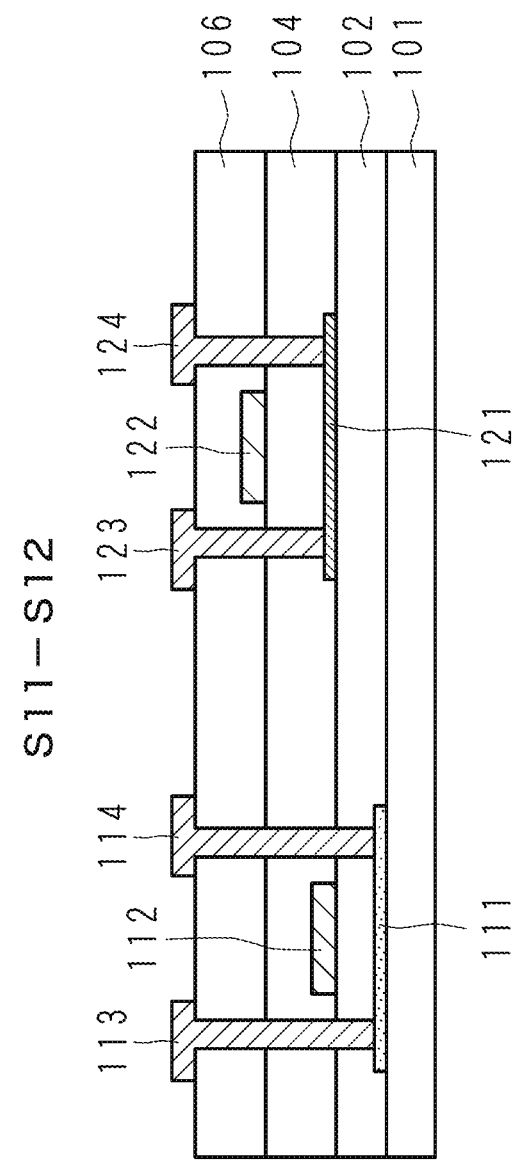

The source 113 and drain 114 of the first transistor 11 as well as the source 123 and drain 124 of the second transistor 12 are formed on the insulating interlayer 106 (step S12). The source 113 and the drain 114 are connected to the polysilicon layer 111 through the contact holes 1131 and 1141, respectively. The source 123 and the drain 124 are connected to the oxide-semiconductor layer 121 through the contact holes 1231 and 1241, respectively. At step S12, the spattering method or the like is used to deposit the third metal layer 107. The third metal layer 107 is composed of molybdenum (Mo), or an alloy of molybdenum such as molybdenum tantalum (MoTa) or molybdenum tungsten (MoW). Thereafter, by the photoresist step, the source 113, the drain 114, the source 123 and the drain 124 are formed. The state illustrated in FIG. 9B is thus obtained.

As described above, since the scanning line SL is a part of the first metal layer 103, it is formed at step S3. Moreover, since the lower electrode 131 of the storage capacitor 13 is a part of the second metal layer 105, they are formed at step S9. Furthermore, since the signal line DL and the power line VL are part of the third metal layer 107, they are formed at step S12. The power line VL is integrated with the drain 124.

Embodiment 2

In the present embodiment, a configuration will be described in which a region having a locally high hydrogen concentration is formed around the interface of the first-gate-insulating layer 102 or the oxide-semiconductor layer 121.

FIGS. 10A to 10C, 11A to 11C and 12A to 12B are cross-sectional views illustrating the manufacturing procedure for the semiconductor device 110 according to Embodiment 2. As in Embodiment 1, the polysilicon layer 111 is formed on the insulating substrate 101 (FIG. 10A), and thereafter the first-gate-insulating layer 102 is formed on the insulating substrate 101 and the polysilicon layer 111 (FIG. 10B). In Embodiment 2, the first-gate-insulating layer 102 is made of $SiO_x$.

The gate 112 of the first transistor 11 is formed on the first-gate-insulating layer 102, the steps S4 and S5 as described earlier are performed, and then the hydrogenation step is carried out (FIG. 10C). In the hydrogenation step, hydrogen plasma with the process temperature of 390° C., the hydrogen gas pressure of 400 Pa and the RF electric density of 1.3 W/cm$^2$ is used, while the time for radiating hydrogen plasma (hydrogenation process time) is set as fifteen minutes or thirty minutes.

Figure 11A:
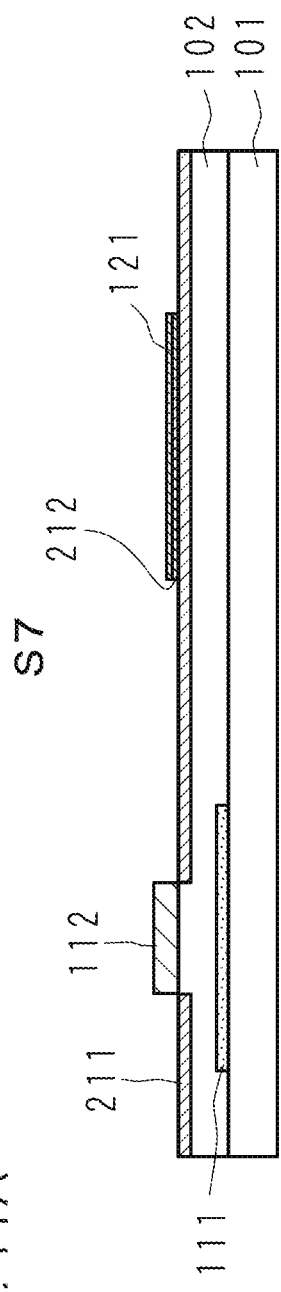
FIGS. 11A-11C are cross-sectional views illustrating a manufacturing procedure for a semiconductor device according to Embodiment 2.
Figure 11B:
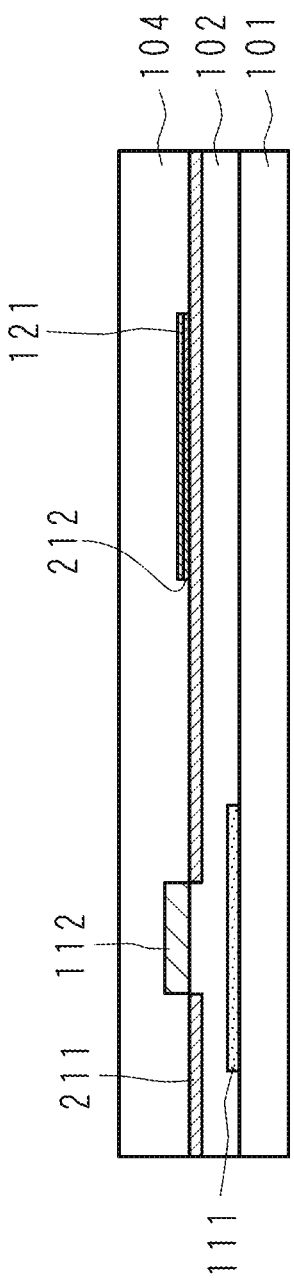

After the hydrogenation step, IGZO as the oxide-semiconductor layer 121 is sputtered and patterned, to form an IGZO layer. In the present embodiment, the IGZO as the oxide-semiconductor layer 121 is deposited to have a film thickness of 70 nm by the spattering method. Thereafter, under the atmospheric pressure, annealing is performed at 400° C. for one hour (FIG. 11A). As illustrated in FIG. 11A, on the plane where the gate 112 and the layer of the same level of the gate 112 are not exist, a region with high hydrogen concentration is formed around the interface of the first-gate-insulating layer 102 or the oxide-semiconductor layer 121. It is estimated that such the layer structure occurs because hydrogen plasma tend not to transmit through the gate 112 and the layer of the same level as the gate 112.

The region having high hydrogen concentration is constituted by a first-gate-insulating layer containing high-concentration hydrogen 211 and an oxide-semiconductor layer containing high-concentration hydrogen 212. Here, the first-gate-insulating layer containing high-concentration hydrogen 211 is formed in the vicinity of the interface with the oxide-semiconductor layer 121 in the first-gate-insulating layer 102, representing the region (layer) where the hydrogen concentration is at local maximum (locally maximized). Moreover, the oxide-semiconductor layer containing high-concentration hydrogen 212 is formed in the vicinity of the interface with the first-gate-insulating layer 102 in the oxide-semiconductor layer 121, representing the region (layer) where the hydrogen concentration is at local maximum (locally maximized).

It is noted that the region with high hydrogen concentration, depending on the material for the first-gate-insulating layer 102, the material for the oxide-semiconductor layer 121, and the condition of the hydrogenation process, may be constituted by either one of the first-gate-insulating layer containing high-concentration hydrogen 211 and the semiconductor layer containing high-concentration hydrogen 212.

Figure 11C:
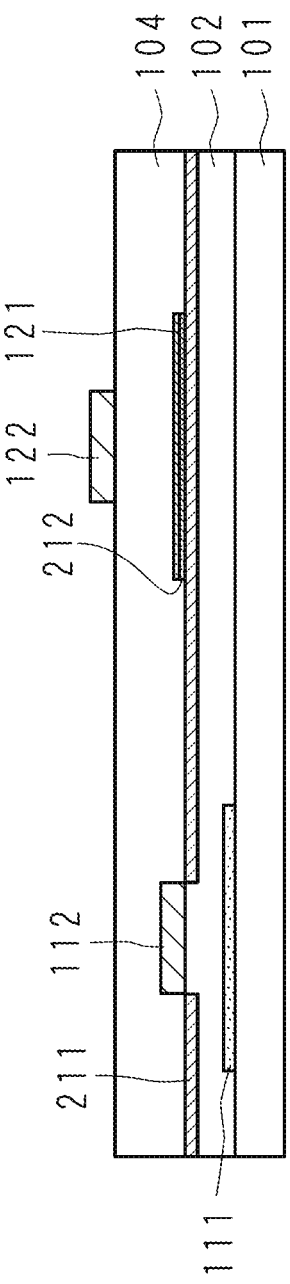

Subsequently, with the procedure similar to that in Embodiment 1, the second-gate-insulating layer 104 is formed (FIG. 11B), and the gate 122 of the second transistor 12 is formed on the second-gate-insulating layer 104 (FIG. 11C).

Moreover, the insulating interlayer 106 is formed on the second-gate-insulating layer 104 and the gate 122 (FIG. 12A), and the source 113 and drain 114 of the first transistor 11 as well as the source 123 and drain 124 of the second transistor 12 are formed on the insulating interlayer 106 (FIG. 12B).

The inventors measured the distribution of hydrogen concentration in the depth direction from the surface of the oxide-semiconductor layer 121 after the hydrogenation step toward the first-gate-insulating layer 102 by the secondary ion mass spectrometry (SIMS) method in order to clarify the detailed distribution of hydrogen concentration. The SIMS analysis device used for measurement is PHI ADEPT1010. For analysis, ion beam by Cs ions ($Cs^+$) accelerated to 3 keV is used.

Figure 13A:
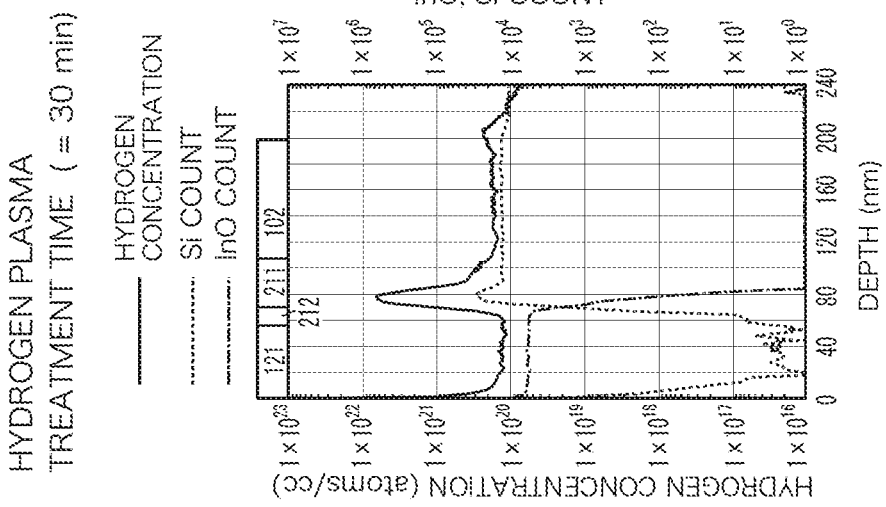
FIGS. 13A-13C are graphs illustrating analysis results for element concentrations in the depth direction based on the SIMS analysis.
Figure 13B:
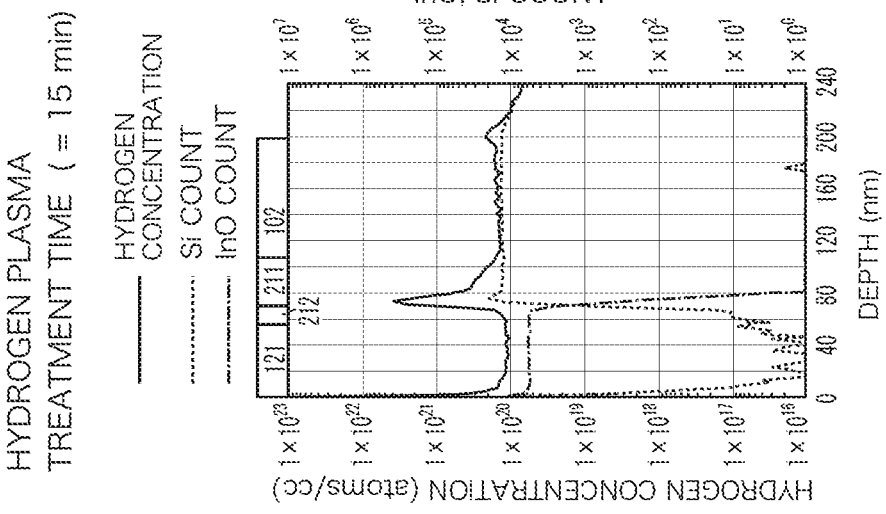
Figure 13C:
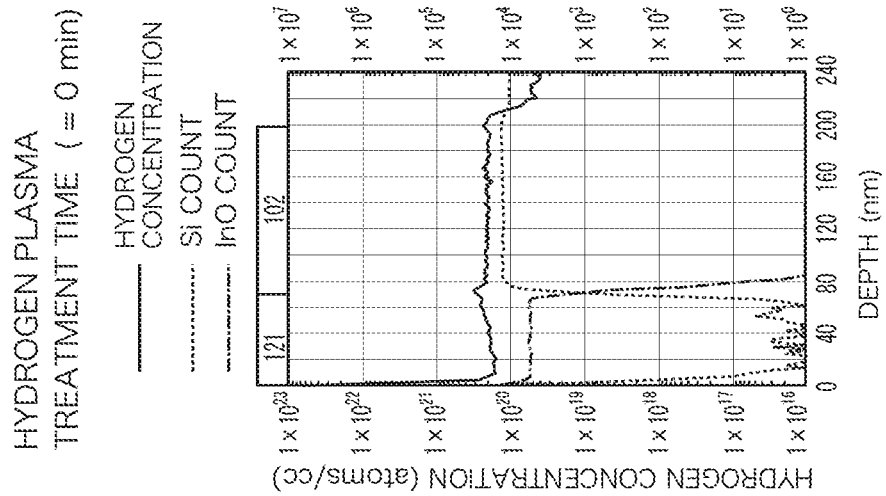

FIGS. 13A to 13C indicate graphs illustrating analysis results for element concentrations in the depth direction based on the SIMS analysis. FIG. 13A is a result of analysis for a sample with hydrogen plasma process time of zero, illustrated as a comparative example. FIG. 13B illustrates a sample with hydrogen plasma process time of fifteen minutes, and FIG. 13C illustrates a sample with hydrogen plasma process time of thirty minutes. The horizontal axis in each graph indicates the distance of the surface in the depth direction, the left vertical axis indicates hydrogen concentration, and the right vertical axis is the counted number of Si and InO. From the distribution of the counted numbers of Si and InO, it is possible to discriminate the interfaces of the IGZO layer and the $SiO_x$ layer. It can thus be estimated that the interfaces of the IGZO layer and the $SiO_x$ layer are exist at the depth around which the counted number of Si and the counted number of InO cross each other. In the vicinity of the surface, all of hydrogen, Si and InO indicate high values. This is possibly caused by contamination at the time of measurement, and thus is excluded from the following discussion.

Each of FIGS. 13B and 13C where the hydrogenation process is performed indicates one peak having significantly high hydrogen concentration of $1 \times 10^{20}$ cm$^{-3}$ or higher. Moreover, it has become clear that the peak is exist at the thickness exceeding 40 nm. The peak value is a value ten times higher or more than the value of the typical hydrogen concentration ($1 \times 10^{20}$ cm$^{-3}$ to $2 \times 10^{20}$ cm$^{-3}$) in a layer such as the IGZO layer or the $SiO_x$ layer.

Moreover, the peak of hydrogen concentration corresponds to the depth around the area where the counted number of Si and the counted number of InO cross each other. Thus, the area around the interfaces of the oxide-semiconductor layer containing high-concentration hydrogen 212 (IGZO layer) and the first-gate-insulating layer containing high-concentration hydrogen 211 ($SiO_x$ layer) has high hydrogen concentration. It has further been found that the peak in the distribution of hydrogen concentration in the depth direction is exist at the thickness of approximately 40 nm around the maximum value.

Meanwhile, FIG. 13A where no hydrogenation process is performed indicates no peak of hydrogen concentration around the interfaces of the oxide-semiconductor layer 212 (IGZO layer) and the first-gate-insulating layer 102 ($SiO_x$ layer), and therefore neither the first-gate-insulating layer containing high-concentration hydrogen 211 nor the oxide-semiconductor layer containing high-concentration hydrogen 212 is exist.

Furthermore, as a result of measuring the sheet resistance for the oxide-semiconductor layer (including oxide-semiconductor layer containing high-concentration hydrogen) in these samples, the sample not subjected to the hydrogenation process has the sheet resistance of $1.90 \times 10^8$ Ω/sq, the sample subjected to 15-minute hydrogenation process has the sheet resistance of $8.09 \times 10^7$ Ω/sq, and the sample subjected to a 30-minute hydrogenation process has the sheet resistance of $3.33 \times 10^6$ Ω/sq. It has been found from these results that the sheet resistance is decreased as the time for hydrogenation process is increased.

A possible reason for the lowering in the sheet resistance value of the oxide-semiconductor layer is as follows. Oxygen deficiency is generated in the oxide-semiconductor layer containing high-concentration hydrogen 212 due to the reduction of hydrogen. As a result, it is presumable that a carrier is generated in the oxide-semiconductor layer containing high-concentration hydrogen 212, lowering the sheet resistance value. It is thus possible that the sheet resistance value varies depending on the hydrogen concentration.

The Id-Vg characteristic for the IGZO-TFT prepared under the processing conditions in FIGS. 13A to 13C is measured, to obtain such a characteristic that the drain current (Id) starts to increase (the transistor is turned on) at around 0 V when the gate voltage is gradually increased under the conditions of FIGS. 13A and 13B. Under the condition of FIG. 13C, on the other hand, such a characteristic is obtained that the transistor is turned on at the gate voltage of around −7 V. It is estimated that the TFT characteristic under the condition in FIG. 13C is mainly caused by the generation of excessive carriers in the oxide-semiconductor layer containing high-concentration hydrogen.

In the case where the transistor prepared under the condition in FIG. 13C is used as a switching element, the drain current value at the gate voltage of 0 V is too high to secure a sufficient on/off ratio of the transistor. It is thus difficult for such a transistor to be used as a switching element.

Additional experiments have obtained the following findings. In the distribution of hydrogen concentration in the depth direction observed by the SIMS measurement, when the peak value of hydrogen concentration is $1 \times 10^{22}$ cm$^{-3}$ or higher, the gate voltage at which the TFT starts to be turned on is −15 V or lower, and thus the TFT cannot be used as a switching element.

Under the present conditions, the required time for the hydrogenation process is fifteen minutes or longer in order for the polysilicon (LTPS) TFT which is the first transistor 11 to operate in a preferable manner. While the first transistor prepared under the condition in FIG. 13A with no hydrogenation process time is defective, the first transistor 11 processed under the conditions in FIGS. 13B and 13C have preferable TFT characteristics.

Thus, in order to use a polysilicon thin film transistor which is the first transistor 11 and IGZO-TFT which is the second transistor 12 as switching elements, it is desirable that the peak value of hydrogen concentration in the vicinity of the interfaces of the SiO$_x$ layer and the IGZO layer is equal to or more than $1 \times 10^{21}$ cm$^{-3}$ and less than $1 \times 10^{22}$ cm$^{-3}$. When the base hydrogen concentration is constant ($1 \times 10^{20}$ cm$^{-3}$), it is desirable that the hydrogen concentration peak value is 10 times or more and less than 100 times.

More preferably, the peak value of hydrogen concentration in the vicinity of the interfaces of the SiO$_x$ layer and the IGZO layer is desirably equal to or higher than $1 \times 10^{21}$ cm$^{-3}$ and less than $8 \times 10^{21}$ cm$^{-3}$. When the base hydrogen concentration is constant ($1 \times 10^{20}$ cm$^{-3}$), it is desirable that the hydrogen concentration peak value is 10 times or more and less than 80 times. When the peak value of hydrogen concentration is under the condition described earlier, both of the TFT characteristics of the first transistor 11 and the second transistor 12 may be made preferable.

According to the present embodiment, the following effects are produced. After the hydrogenation step (step S6) included in the step of forming the first transistor 11, the oxide-semiconductor layer 121 which will serve as a channel for the second transistor 12 is formed (step S7). This can reduce the possibility of the oxide-semiconductor layer 121 being exposed to hydrogen plasma. If the oxide-semiconductor layer 121 is exposed to hydrogen plasma, oxygen contained in the oxide-semiconductor layer 121 reacts with hydrogen. The amount of oxygen contained in the oxide-semiconductor layer 121 is then reduced. This lowers the electric resistance of the oxide-semiconductor layer 121, causing the second transistor 12 to have the normally-on characteristic. According to the present embodiment, however, the possibility of the oxide-semiconductor layer 121 being exposed to hydrogen plasma is reduced, which suppresses degradation in the characteristic of the oxide-semiconductor layer 121. It is therefore possible to suppress the second transistor 12 having the normally-on characteristic. In the case where the oxide thin film transistor is used for a purpose where normally-on is not preferable, a device indicating the normally-on characteristic would be a defective product. According to the present embodiment, however, the second transistor 14 may be prevented from having the normally-on characteristic, which suppresses lowering in the yield of the semiconductor device 110.

Embodiment 3 (formerly Embodiment 2)

Figure 14:
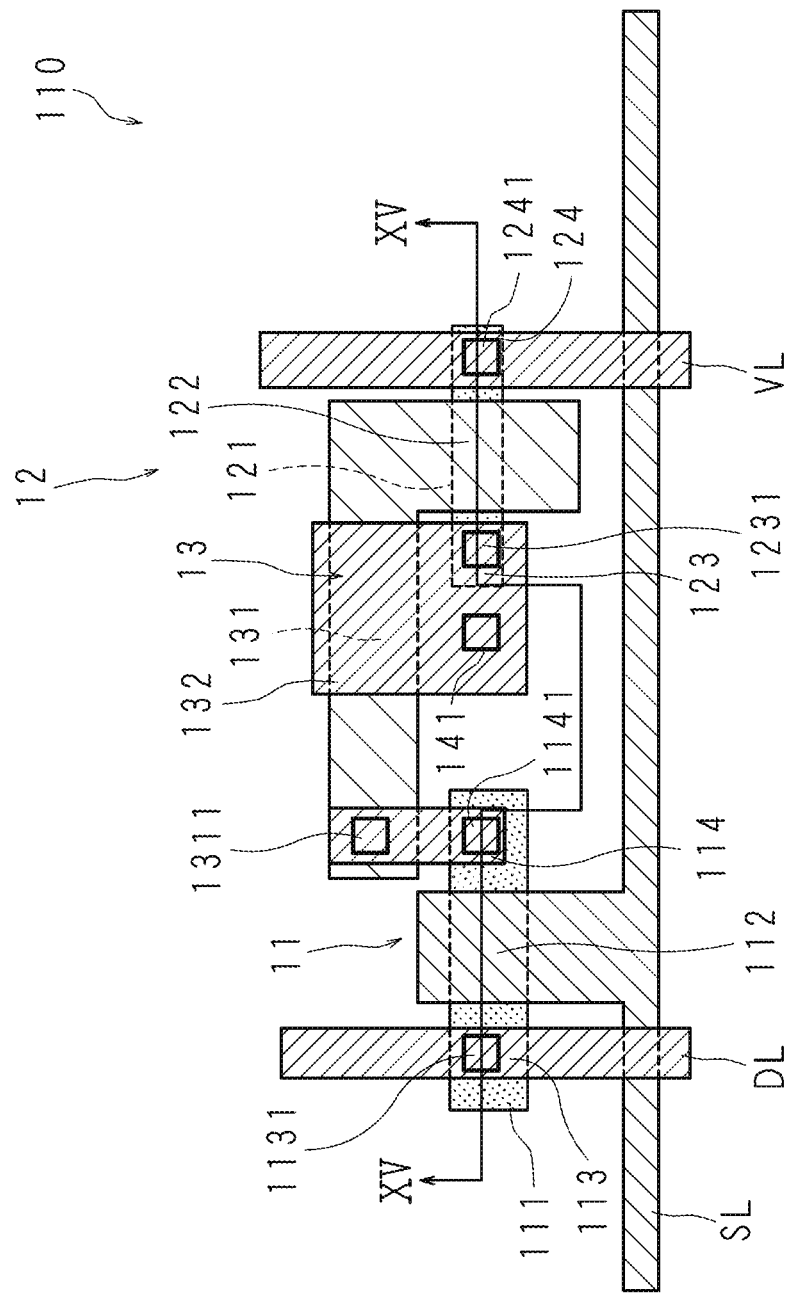
FIG. 14 is a plan view illustrating a configuration example of a semiconductor device included in a pixel drive circuit.
Figure 15:
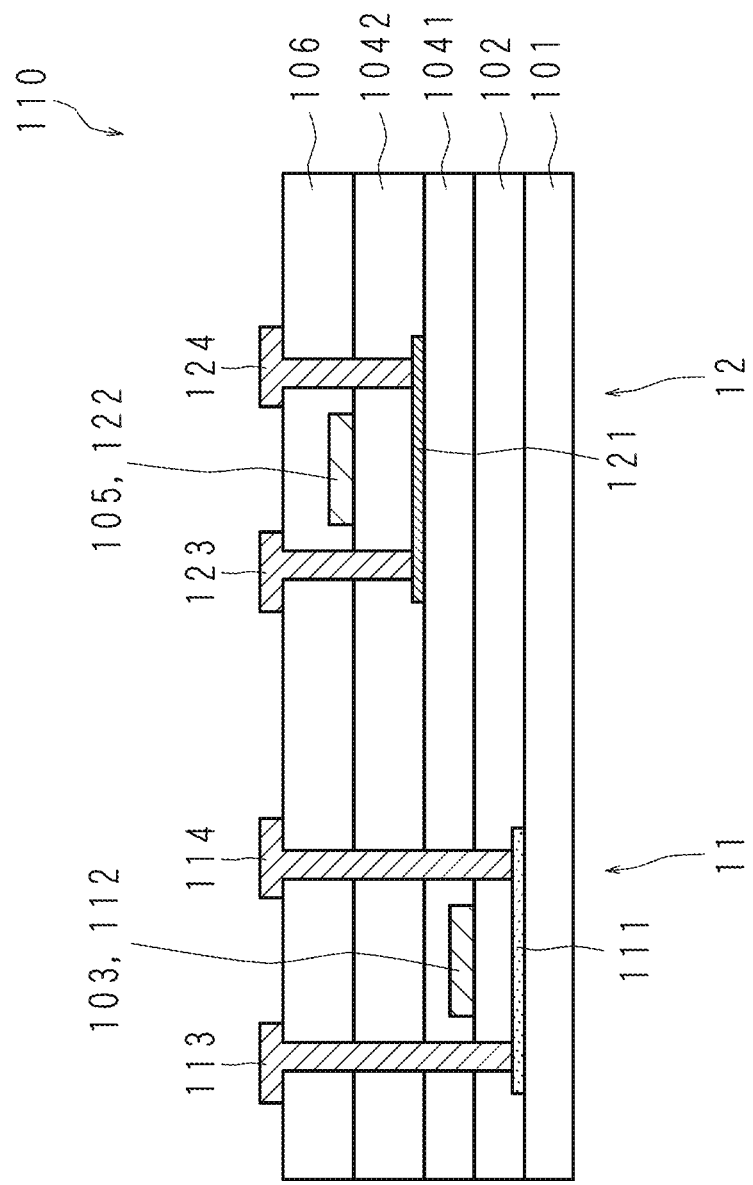
FIG. 15 is a cross-sectional view taken along the section line XV-XV in FIG. 14.

The present embodiment relates to a configuration where a second insulating interlayer 1041 is formed between the first-gate-insulating layer 102 and the second-gate-insulating layer 1042. FIG. 14 is a plan view illustrating a configuration example of a semiconductor device 110 included in a pixel drive circuit. FIG. 15 is a cross-sectional view taken along the section line XV-XV in FIG. 14. In FIGS. 14 and 15, configuration parts similar to those in Embodiment 1 illustrated in FIGS. 3 and 4 are denoted by the same reference codes and will not be described here.

In the present embodiment, as illustrated in FIG. 15, a second insulating interlayer 1041 is formed on the first-gate-insulating layer 102 and the first metal layer 103. The oxide-semiconductor layer 121 is formed on the second insulating interlayer 1041. The second-gate-insulating layer 1042 is formed on the second insulating interlayer 1041 and the oxide-semiconductor layer 121. Furthermore, the second metal layer 105 is formed on the second-gate-insulating layer 1042. The oxide-semiconductor layer 121 in the second transistor 12 is formed on the second insulating interlayer 1041. The oxide-semiconductor layer 121 and the source 123 are electrically connected to each other through the contact hole 1231. The oxide-semiconductor layer 121 and the drain 124 are electrically connected to each other through the contact hole 1241. In the present embodiment, the second transistor 12 is a top gate planar self-aligned type thin film transistor.

Figure 16:
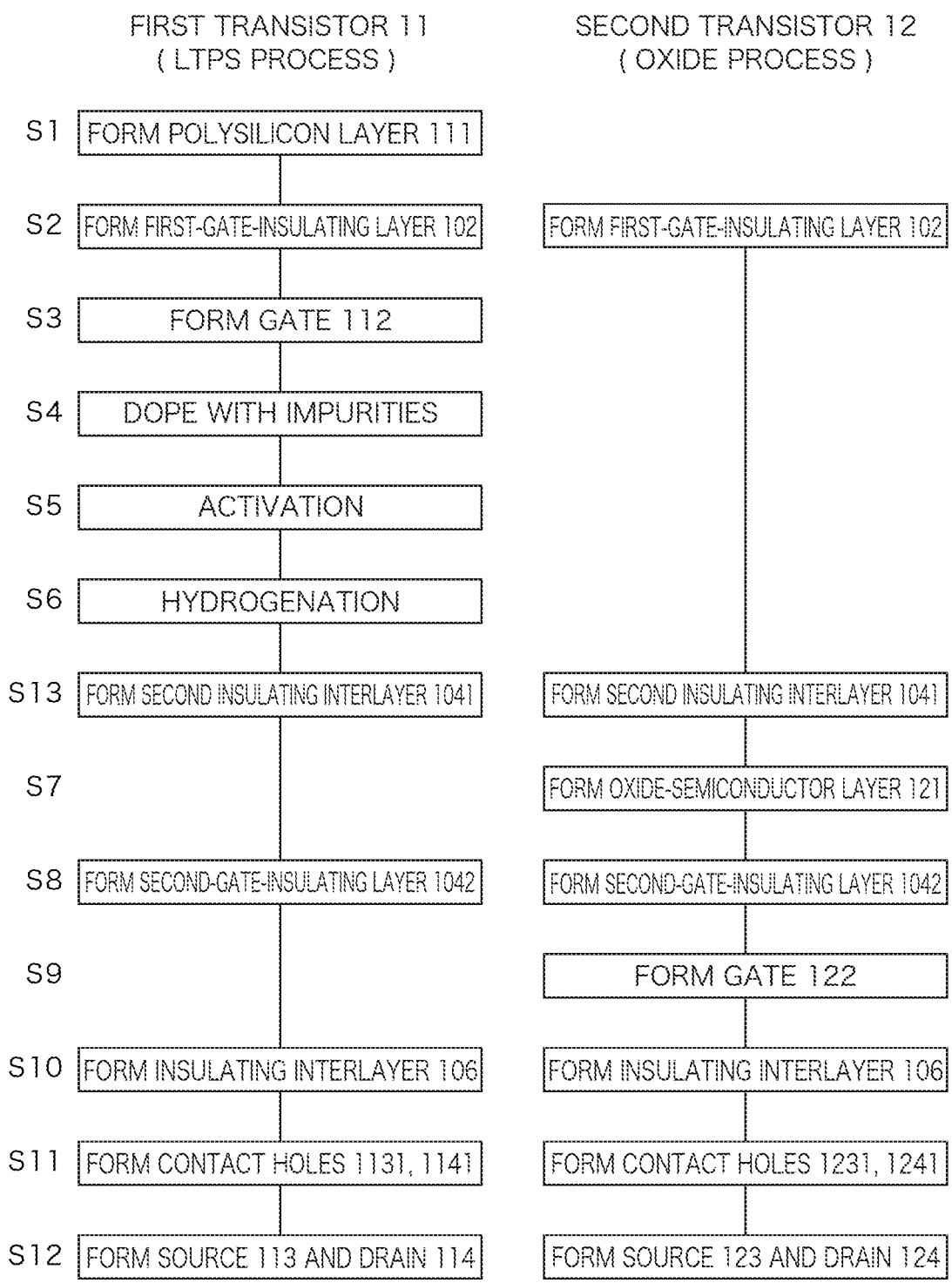
FIG. 16 is a flowchart illustrating a manufacturing procedure for a semiconductor device.

A manufacturing procedure for the semiconductor device 110 will now be described. FIG. 16 is a flowchart illustrating a manufacturing procedure for the semiconductor device 110. FIGS. 17A to 17D, 18A to 18B and 19A to 19B are cross-sectional views illustrating the manufacturing procedure for the semiconductor device 110. The cross-sections in FIGS. 17A to 17D, 18A to 18C and 19A and 19B are similar to the cross-section in FIG. 15. In FIG. 16, procedures similar to those in FIG. 6 will be denoted by the same step numbers and will not be described. Also for FIGS. 17A to 17D, 18A to 18C, and 19A to 19B, details similar to those in FIGS. 7A to 7C, 8A to 8C and 9A to 9B will not be described here.

In the present embodiment, after the polysilicon layer 111 included in the first transistor 11 is hydrogenated (step S6), the second insulating interlayer 1041 is formed (step S13). The state illustrated in FIG. 17D is thus obtained.

The oxide-semiconductor layer 121 is formed on the second insulating interlayer 1041 (step S7). The state illustrated in FIG. 18A is thus obtained. The second-gate-insulating layer 1042 is formed (step S8). The state illustrated in FIG. 18B is thus obtained. Steps S10 and S11 are executed to obtain the state illustrated in FIG. 19B.

The present embodiment produces the following effects in addition to those produced in Embodiment 1. After the polysilicon layer 111 is hydrogenated (step S6), the second insulating interlayer 1041 is formed (step S13). Even when the hydrogen used for hydrogenation remains by, for example, being adhered to the surfaces of the first-gate-insulating layer 102, the hydrogen is blocked by the second insulating interlayer 1041, and as a result, the hydrogen hardly diffuses into the oxide-semiconductor layer 121. This can suppress degradation in the characteristic of the oxide-semiconductor layer 121.

Embodiment 4

Embodiment 4 is a specific example based on Embodiment 2. In the present embodiment, the first-gate-insulating layer 112 and the insulating interlayer 106 are made of $SiO_x$. The specific process conditions for the hydrogenation step (step S6) in FIG. 16 are so set that hydrogen plasma with the process temperature of 390° C., the hydrogen gas pressure of 400 Pa and the RF electric density of 1.3 W/cm$^2$ is used, and the time for radiating hydrogen plasma (hydrogenation process time) is set as 15 minutes.

Figure 20:
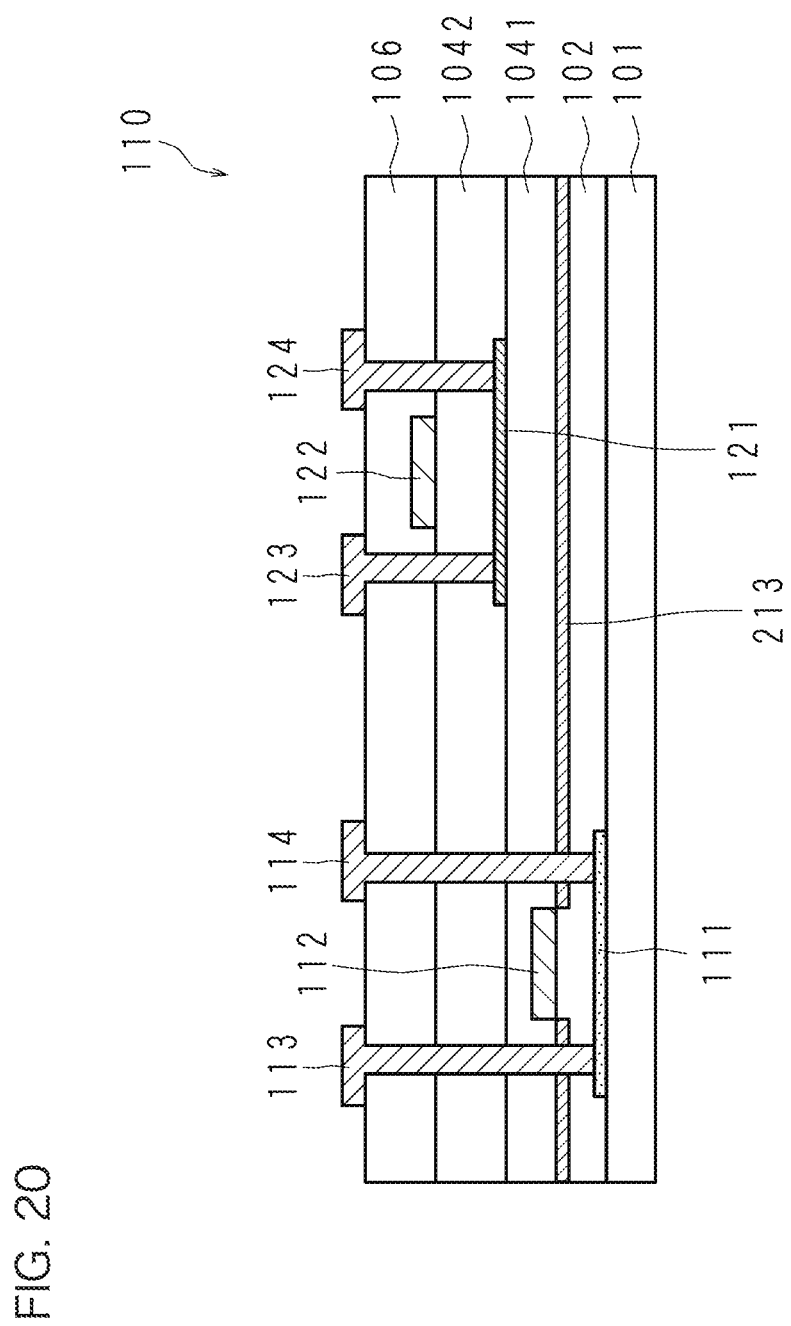
FIG. 20 is a cross-sectional view illustrating a configuration example of a semiconductor device according to Embodiment 4.

FIG. 20 is a cross-sectional view illustrating a configuration example of a semiconductor device 110 according to Embodiment 4. As illustrated in FIG. 20, a region with locally high hydrogen concentration is formed between the first-gate-insulating layer 102 and the second insulating interlayer 1041 as a first-gate-insulating layer containing high-concentration hydrogen 213.

Details of the hydrogen concentration in the first-gate-insulating layer containing high-concentration hydrogen 213 and the structure thereof are found by the experiment and analysis described below. In the experiment, after the $SiO_x$ film is deposited on the insulating substrate 101 as the first-gate-insulating layer 102, the gate 112 is formed, impurities are injected and an activation step is performed. Thereafter, the hydrogenation step is carried out. Next, after washed with pure water, $SiO_x$ is deposited to the film thickness of 200 nm as the second insulating interlayer 1041 at the substrate temperature of 200° C. by the plasma CVD method.

The first-gate-insulating layer containing high-concentration hydrogen 213 is also observed in a region where the gate 112 and the layer of the same level as the gate 112 are absent.

The sample prepared as described above is used to measure, by the SIMS method, the hydrogen concentration distribution in the depth direction from the surface of the second insulating interlayer 1041 made of $SiO_x$ to the inside of the first-gate-insulating layer 102 made of $SiO_x$, to find that a region with locally high hydrogen concentration is exist in the interface regions of the first-gate-insulating layer 102 and the second insulating interlayer 1041.

It has been found that the peak value of hydrogen concentration in this region corresponds to $1 \times 10^{21}$ cm$^{-3}$ or higher, which is a value ten times higher or more than the value of the typical hydrogen concentration ($1 \times 10^{20}$ cm$^{-3}$ to $2 \times 10^{20}$ cm$^{-3}$) in the first-gate-insulating layer 102 ($SiO_x$) or the second insulating interlayer 1041 ($SiO_x$).

According to the present embodiment, the second transistor 12 is not affected by hydrogen concentration, and may operate in a preferable manner.

Embodiment 5

In Embodiment 5, an example form is described where the hydrogenation step of step S6 and the step of forming the second insulating interlayer 1041 of step S13 are switched from each other in the manufacturing procedure illustrated in FIG. 16.

FIG. 21 is a cross-sectional view illustrating a configuration example of a semiconductor device 110 according to Embodiment 5. As illustrated in FIG. 21, the region with high hydrogen concentration is exist at the interfaces of the second insulating interlayer 1041 and the oxide-semiconductor layer 121. After forming the source 123 and the drain 124 of the second transistor 12, IGZO is formed as the oxide-semiconductor layer 121, and then annealing is carried out at 400° C. in the atmospheric pressure for one hour.

As a result, a second insulating interlayer containing high-concentration hydrogen 214 which is an insulating interlayer region with locally high hydrogen concentration and a oxide-semiconductor layer containing high-concentration hydrogen 212 which is an oxide semiconductor region with locally high hydrogen concentration are formed.

A contact portion between the oxide-semiconductor layer 121 and the second insulating interlayer 1041 in this sample is subjected to the SIMS analysis. It has been found, as a result, that the hydrogen concentration distribution in the depth direction from the surface of IGZO to the inside of the $SiO_x$ film has a peak at which the hydrogen concentration becomes high in the interface regions of the oxide-semiconductor layer 121 and the second insulating interlayer 1041, and that the hydrogen concentration at the peak is ten times higher or more than the typical hydrogen concentration in the inner regions of the second insulating interlayer 1041 and the oxide-semiconductor layer 121.

It is also found that, when the peak hydrogen concentration in the interface regions of the second insulating interlayer 1041 and the oxide-semiconductor layer 121 is less than $1 \times 10^{22}$ cm$^{-3}$, the oxide semiconductor TFT may be used as a switching element.

According to Embodiment 1, as illustrated in step S7 in FIG. 8A, it is necessary to deposit the oxide semiconductor film on the first-gate-insulating layer 102 on which the gate 112 is formed and to pattern the oxide semiconductor film into a desired shape. Thus, selective etching is required, which etches only the oxide semiconductor film without etching the previously-formed gate. According to Embodiment 3, on the other hand, no oxide semiconductor is deposited on the second-gate-insulating layer 1042 on which the first metal layer 103 serving as the gate 112 has already been formed. It is thus unnecessary to form the oxide-semiconductor layer 121 by selective etching. In the selective etching, etchant may deteriorate the characteristic of the first metal layer 103. According to the present embodiment, however, the selective etching is unnecessary, which can suppress degradation in the characteristic of the first metal layer 103.

The examples as described above are not limited to these embodiments. For example, after performing the hydrogenation step on the insulation layer, a step of depositing the oxide-semiconductor layer thereon to be in contact with the insulating layer provided with the hydrogenation step, as in the process of Embodiment 1 illustrated in FIG. 5, may produce a similar effect.

That is, the hydrogen concentration which is locally maximized in the interface region of the insulating layer or the interface region of the oxide-semiconductor layer is ten times higher or more than the hydrogen concentration in the inner region of the insulating layer and the inner region of the oxide-semiconductor layer. If the hydrogen concentration which is locally maximized in the interface region of the insulating layer and the interface region of the oxide-semiconductor layer is less than $1 \times 10^{22}$ cm$^{-3}$, the TFT characteristic where the first transistor and the second transistor are both preferable may be obtained.

The processes in Embodiments 1 to 5 are not limited to the process conditions in the present embodiment. For example, the insulating interlayer is deposited after the hydrogenation step is performed on the insulating layer, and a semiconductor device may be obtained in the procedure of depositing the oxide-semiconductor layer on the insulating interlayer.

That is, when the hydrogen concentration which is locally maximized in the interface region of the insulating layer or the interface region of the insulating interlayer is ten times higher or more than the hydrogen concentration in the inner region of the insulating layer and the inner region of the insulating interlayer, and when the hydrogen concentration which is locally maximized in the interface regions of the insulating layer and the insulating interlayer is less than $1 \times 10^{22}$ cm$^{-3}$, the TFT characteristic where the first transistor and the second transistor are both preferable may be obtained.

The technical features (components) described in each embodiment may be combined with one another, and such combinations may form new technical features. It should be understood that the embodiments disclosed herein are illustrative and non-restrictive in every respect. Since the scope of the present invention is defined by the appended claims rather than by the description preceding them, all changes that fall within metes and bounds of the claims, or equivalence of such metes and bounds thereof are therefore intended to be embraced by the claims It is noted that, as used herein and in the appended claims, the singular forms "a", "an", and "the" include plural referents unless the context clearly dictates otherwise.

What is claimed is:

1. A semiconductor device comprising:
   an insulating substrate;
   a polysilicon layer formed on the insulating substrate;
   a first-gate-insulating layer formed on the polysilicon layer;
   a first metal layer formed on the first-gate-insulating layer;
   an oxide-semiconductor layer formed on the first-gate-insulating layer;
   a second-gate-insulating layer formed on the oxide-semiconductor layer;
   a second metal layer formed on the second-gate-insulating layer;
   a first insulating interlayer formed on the second metal layer;
   a third metal layer formed on the first insulating interlayer;
   a second insulating interlayer formed between the first-gate-insulating layer and the second-gate-insulating layer, the oxide-semiconductor layer being formed on the second insulating interlayer;
   a first top gate planar-type thin film transistor in which the polysilicon layer serves as a channel and which has a source, a drain, and a gate; and
   a second top gate planar self-aligned-type thin film transistor in which the oxide-semiconductor layer serves as a channel and which has a source, a drain, and a gate,
   wherein the gate of the first top gate planar-type thin film transistor is made of the first metal layer,
   the gate of the second top gate planar self-aligned-type thin film transistor is made of the second metal layer,
   the source and the drain of the first top gate planar-type thin film transistor and the source and the drain of the second top gate planar self-aligned-type thin film transistor are made of the third metal layer,
   the source or the drain of the first top gate planar-type thin film transistor and the gate of the second top gate planar self-aligned-type thin film transistor are electrically connected to each other,
   a high-hydrogen-concentration region in which the hydrogen concentration becomes local maximum with respect to hydrogen diffused into the first-gate-insulating-layer is formed at an interface region of the first-gate-insulating layer and the second insulating interlayer,
   the hydrogen concentration of the first-gate-insulating layer in a thickness direction of the first-gate-insulating layer gradually increases toward an interface of the first-gate-insulating layer and the second insulating interlayer, and
   the hydrogen concentration of the second insulating interlayer in a thickness direction of the second insulating interlayer gradually increases toward the interface of the second insulating interlayer and the first-gate-insulating layer.

2. The semiconductor device according to claim 1, wherein the hydrogen concentration of the first-gate-insulating layer and the second insulating interlayer in the thickness direction of the first-gate-insulating layer and the second insulating interlayer becomes local maximum at the interface region of the first-gate-insulating layer and the second insulating interlayer.

3. The semiconductor device according to claim 1, wherein a maximum value of the hydrogen concentration of the first-gate-insulating layer in the thickness direction of the first-gate-insulating layer is equal to or higher than $1 \times 10^{21}$ cm$^{-3}$ and less than $1 \times 10^{22}$ cm$^{-3}$.

4. The semiconductor device according to claim 1, wherein a maximum value of the hydrogen concentration of the second insulating interlayer in the thickness direction of the second insulating interlayer is equal to or higher than $1 \times 10^{21}$ cm$^{-3}$ and less than $1 \times 10^{22}$ cm$^{-3}$.

5. The semiconductor device according to claim 1, wherein a maximum value of the hydrogen concentration of the first-gate-insulating layer in the thickness direction of the first-gate-insulating layer is 10 times or more of the hydrogen concentration in an inner region of the first-gate-insulating layer and less than 100 times the hydrogen concentration in the inner region of the first-gate-insulating layer.

6. The semiconductor device according to claim 1, wherein a maximum value of the hydrogen concentration of the second insulating interlayer in the thickness direction of the second insulating interlayer is 10 times or more of the hydrogen concentration in an inner region of the second insulating interlayer and less than 100 times the hydrogen concentration in the inner region of the second insulating interlayer.

7. A display apparatus comprising:
a semiconductor device comprising
an insulating substrate,
a polysilicon layer formed on the insulating substrate,
a first-gate-insulating layer formed on the polysilicon layer,
a first metal layer formed on the first-gate- insulating layer,
an oxide-semiconductor layer formed on the first-gate-insulating layer,
a second-gate-insulating layer formed on the oxide-semiconductor layer,
a second metal layer formed on the second-gate- insulating layer,
a first insulating interlayer formed on the second metal layer,
a third metal layer formed on the first insulating interlayer,
a second insulating interlayer formed between the first-gate-insulating layer and the second-gate-insulating layer, the oxide-semiconductor layer being formed on the second insulating interlayer,
a first top gate planar-type thin film transistor in which the polysilicon layer serves as a channel and which has a source, a drain, and a gate, and
a second top gate planar self-aligned-type thin film transistor in which the oxide-semiconductor layer serves as a channel and which has a source, a drain, and a gate,
the gate of the first top gate planar-type thin film transistor being made of the first metal layer,
the gate of the second top gate planar self- aligned-type thin film transistor being made of the second metal layer,
the source and the drain of the first top gate planar-type thin film transistor and the source and the drain of the second top gate planar self-aligned-type thin film transistor being made of the third metal layer,
the source or the drain of the first top gate planar-type thin film transistor and the gate of the second top gate planar self-aligned-type thin film transistor being electrically connected to each other,
a high-hydrogen-concentration region in which the hydrogen concentration becomes local maximum with respect to hydrogen diffused into the first-gate-insulating-layer being formed at an interface region of the first-gate-insulating layer and the second insulating interlayer,
the hydrogen concentration of the first-gate-insulating layer in a thickness direction of the first-gate-insulating layer gradually increases toward an interface of the first-gate-insulating layer and the second insulating interlayer, and
the hydrogen concentration of the second insulating interlayer in a thickness direction of the second insulating interlayer gradually increases toward the interface of the second insulating interlayer and the first-gate-insulating layer; and
a light emitting element,
wherein the second top gate planar self-aligned-type thin film transistor supplies driving current to the light emitting element, and
the first top gate planar-type thin film transistor controls a gate voltage of the second top gate planar self-aligned-type thin film transistor.

8. The display apparatus according to claim 7, further comprising:
a data line applying voltage to the source or drain of the first top gate planar-type thin film transistor; and
a power line applying power voltage to the second top gate planar self-aligned-type thin film transistor,
wherein the data line and the power supply line are formed of the third metal layer.

9. The display apparatus according to claim 8, further comprising a scan line configured to apply voltage to the gate of the first top gate planar-type thin film transistor,
wherein the scan line is formed of the first metal layer.

* * * * *